US012615717B2

(12) United States Patent
Ueno

(10) Patent No.: US 12,615,717 B2
(45) Date of Patent: Apr. 28, 2026

(54) SEMICONDUCTOR STORAGE DEVICE

(71) Applicant: Kioxia Corporation, Tokyo (JP)

(72) Inventor: Koji Ueno, Toda Saitama (JP)

(73) Assignee: Kioxia Corporation, Tokyo (JP)

( * ) Notice: Subject to any disclaimer, the term of this patent is extended or adjusted under 35 U.S.C. 154(b) by 330 days.

(21) Appl. No.: 18/459,316

(22) Filed: Aug. 31, 2023

(65) Prior Publication Data

US 2024/0206074 A1 Jun. 20, 2024

(30) Foreign Application Priority Data

Dec. 20, 2022 (JP) ................................. 2022-203364

(51) Int. Cl.
H05K 1/182 (2026.01)

(52) U.S. Cl.
CPC ... H05K 1/182 (2013.01); H05K 2201/09072 (2013.01); H05K 2201/09163 (2013.01); H05K 2201/10015 (2013.01); H05K 2201/10159 (2013.01); H05K 2201/10189 (2013.01); H05K 2201/10583 (2013.01); H05K 2201/10651 (2013.01); H05K 2201/10757 (2013.01)

(58) Field of Classification Search
CPC .......... H05K 1/18; H05K 1/181; H05K 3/301; H05K 7/12; H05K 2201/09163; H05K 2201/10015; H05K 2201/10159; H05K 2201/10189; H05K 2201/10583; H05K 2201/10651; H05K 2201/10757; H01L 23/498; H01L 23/49811; H01L 23/49838; H01L 23/12; H01L 23/16

USPC ........ 361/760, 765, 772–774, 782–784, 803, 361/756–759, 807–810
See application file for complete search history.

(56) References Cited

U.S. PATENT DOCUMENTS

| 6,305,972 B1 * | 10/2001 | Isbell ..................... H05K 3/301 |
| | | 361/767 |
| 7,791,887 B2 * | 9/2010 | Ganev .................... H05K 7/209 |
| | | 361/274.3 |
| 8,451,617 B2 * | 5/2013 | Chan ........................ H05K 1/18 |
| | | 361/766 |
| 10,219,382 B2 * | 2/2019 | Joo .......................... H05K 7/12 |
| 10,600,580 B2 * | 3/2020 | Joo .......................... H01G 9/28 |

(Continued)

FOREIGN PATENT DOCUMENTS

| JP | 2014-096537 A | 5/2014 |
| JP | 2022-049327 A | 3/2022 |

*Primary Examiner* — Tuan T Dinh
(74) *Attorney, Agent, or Firm* — Kim & Stewart LLP

(57) ABSTRACT

A semiconductor storage device including a board, an electronic component, and a holder. The board has a region with an opening. The electronic component includes a component body disposed in the opening and a lead protruding from the component body and connected to the board. The holder is disposed in the opening and supports the component body. The region includes first and second edges on either side of the opening, the first and second edges extending along a first direction and separated from each other in a second direction crossing the first direction. The holder includes a holder body at least partially formed in an annular shape and into which the component body is inserted, a first groove extending along the first direction and engaged with the first edge, and a second groove extending along the first direction and engaged with the second edge.

20 Claims, 17 Drawing Sheets

(56)     References Cited

U.S. PATENT DOCUMENTS

| | | | | |
|---|---|---|---|---|
| 11,755,078 | B2 * | 9/2023 | Burski | G06F 1/30 |
| | | | | 361/679.33 |
| 11,785,703 | B2 * | 10/2023 | Nagasawa | H05K 1/181 |
| | | | | 361/679.31 |
| 2013/0140079 | A1 * | 6/2013 | Nakamura | H05K 3/301 |
| | | | | 174/551 |
| 2016/0295697 | A1 | 10/2016 | Nakamura | |
| 2019/0006101 | A1 * | 1/2019 | Matsumae | H01G 9/08 |
| 2021/0015006 | A1 * | 1/2021 | Muto | H05K 5/13 |
| 2021/0345489 | A1 | 11/2021 | Ryu et al. | |
| 2022/0087072 | A1 | 3/2022 | Matsuda | |

* cited by examiner

SEMICONDUCTOR STORAGE DEVICE

CROSS-REFERENCE TO RELATED APPLICATION(S)

This application is based upon and claims the benefit of priority from Japanese Patent Application No. 2022-203364, filed Dec. 20, 2022, the entire contents of which are incorporated herein by reference.

FIELD

Embodiments described herein relate generally to a semiconductor storage device.

BACKGROUND

A semiconductor storage device including a board and a capacitor mounted on the board is known.

DESCRIPTION OF THE DRAWINGS

FIG. 3 is a diagram illustrating a mounting structure of the first embodiment.

FIG. 12 is a diagram illustrating a mounting structure of a third embodiment.

FIG. 18 is a diagram illustrating a mounting structure of a fifth embodiment.

DETAILED DESCRIPTION

Figure 1:
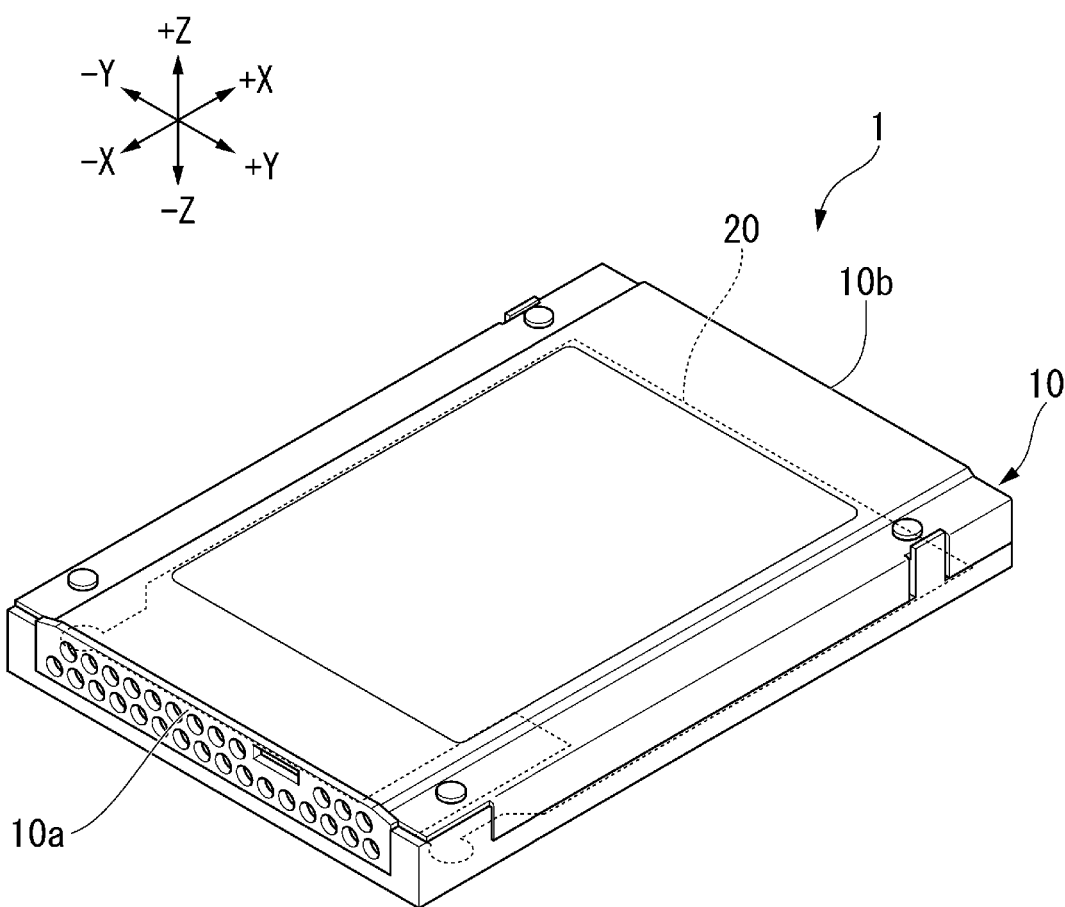
FIG. 1 is a perspective view illustrating a semiconductor storage device of a first embodiment.

Embodiments provide a semiconductor storage device that can improve a degree of freedom in design.

In general, according to one embodiment, there is provided a semiconductor storage device including a board, an electronic component, and a holder. The board includes a region with an opening. The electronic component includes a component body disposed in the opening and a lead protruding from the component body and connected to the board. The holder is disposed in the opening and supports the component body. The opening includes first and second edges on either side of the opening, the first and second edges extending along a first direction and separated from each other in a second direction crossing the first direction. The holder includes a holder body at least partially formed in an annular shape and into which the component body is inserted, a first groove extending along the first direction and engaged with the first edge, and a second groove extending along the first direction and engaged with the second edge.

Hereinafter, the semiconductor storage device according to an embodiment will be described with reference to the drawings. In the following description, same reference numerals are given to configurations having same or similar functions. Duplicate descriptions of such configurations may be omitted. In the present application, "parallel", "orthogonal", or "same" may include cases where the components are "substantially parallel", "substantially orthogonal", or "substantially the same", respectively. In the present application, "overlapping" means that virtual projected images of two objects overlap each other, and may include a case where the two objects do not directly contact each other (for example, a case where another member exists between the two objects). In the present application, "connection" is not limited to mechanical connection, and may include electrical connection. That is, "connection" is not limited to direct connection with an object, but may include connection with another member interposed therebetween.

Here, +X-direction, −X-direction, +Y-direction, −Y-direction, +Z-direction, and −Z-direction are defined first. The +X-direction, −X-direction, +Y-direction, and −Y-direction are directions parallel to a first surface S1 (see FIG. 2) of a board 21, which will be described later. The +X-direction is a direction from a first end 21a toward a second end 21b of the board 21, which will be described later (see FIG. 2). The −X-direction is a direction opposite to the +X-direction. When the +X-direction and the −X-direction are not distinguished, the directions are simply referred to as the "X-direction". The +Y-direction and the −Y-direction are directions that cross (for example, are orthogonal to) the X-direction. The +Y-direction is a direction from a third end 21c toward a fourth end 21d of the board 21, which will be described later (see FIG. 2). The −Y-direction is a direction opposite to the +Y-direction. When the +Y-direction and the −Y-direction are not distinguished, the directions are simply referred to as the "Y-direction". The +Z-direction and the −Z-direction are directions that cross (for example, are orthogonal to) the X-direction and the Y-direction, and are thickness directions of the board 21, which will be described later. The +Z-direction is a direction from a second surface S2 toward the first surface S1 of the board 21, which will be described later (see FIG. 2). The −Z-direction is a direction opposite to the +Z-direction. When the +Z-direction and the −Z-direction are not distinguished, the directions are simply referred to as the "Z-direction". The +X-direction is an example of a "first direction". The +Y-direction is an example of a "second direction". The +Z-direction is an example of a "third direction".

First Embodiment

1. Overall Configuration of Semiconductor Storage Device

A semiconductor storage device 1 of the first embodiment will be described with reference to FIGS. 1 to 6. The semiconductor storage device 1 is, for example, a storage device such as a solid state drive (SSD). The semiconductor storage device 1 is attached to, for example, an information processing device such as a server or a personal computer, and used as a storage region of the information processing device. In the present application, the information processing device to which the semiconductor storage device 1 is attached is called a "host device".

FIG. 1 is a perspective view illustrating the semiconductor storage device 1. The semiconductor storage device 1 includes a casing 10 and a board unit 20, for example.

1.1 Casing

The casing 10 is a member that forms an outer shell of the semiconductor storage device 1. The casing 10 accommodates the board unit 20. The casing 10 has, for example, a flat rectangular box shape. The casing 10 includes a first wall 10a and a second wall 10b as a pair of walls separated in the longitudinal direction of the casing 10 (X-direction). The second wall 10b includes a connector 22 (see FIG. 2) of the board unit 20, which will be described later, in an opening (not illustrated) exposed to the outside of the casing 10.

1.2 Board Unit

Figure 2:
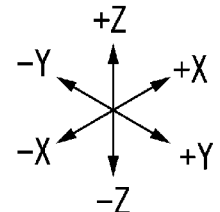
FIG. 2 is a perspective view illustrating a board unit of the first embodiment.
Figure 2:
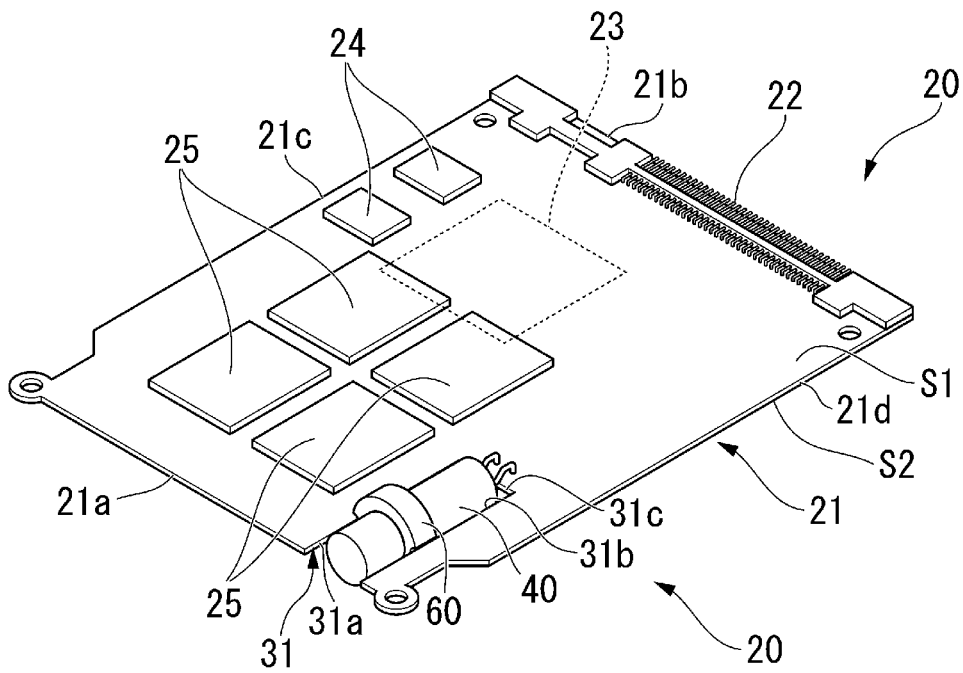

FIG. 2 is a perspective view illustrating the board unit 20. The board unit 20 includes the board 21, the connector 22, a controller 23, a plurality of dynamic random access memories (DRAMs) 24, a plurality of NAND memories 25 (hereinafter referred to as "NANDs 25"), a capacitor 40, and a holder 60, for example.

The board 21 is a plate member extending along the X-direction and the Y-direction. The board 21 is a printed board and includes an insulating base material and a wiring pattern provided on the insulating base material. The board 21 includes the first surface S1 and the second surface S2 positioned on a side opposite to the first surface S1. The first surface S1 is a surface facing the +Z-direction. The second surface S2 is a surface facing the −Z-direction.

The board 21 includes the first end 21a and the second end 21b as a pair of ends separated in the longitudinal direction of the board 21 (X-direction). The board 21 includes the third end 21c and the fourth end 21d as a pair of ends separated in the lateral direction of the board 21 (Y-direction).

In the embodiment, the board 21 includes a notch 31 for accommodating the capacitor 40. The notch 31 is an example of a "space part". The notch 31 penetrates through the board 21 in the Z-direction. In the embodiment, the notch 31 is provided adjacent to the first end 21a of the board 21 and extends from the first end 21a of the board 21 in the +X-direction. The notch 31 has, for example, a rectangular shape. The longitudinal direction of the notch 31 is along the X-direction. However, the notch 31 is not limited to the above example, and may extend in the Y-direction from the third end 21c or the fourth end 21d of the board 21, for example.

The connector 22 includes a plurality of metal terminals that are connectable with a connector of the host device. The connector 22 is provided on the second end 21b of the board 21.

The controller 23 controls the entire semiconductor storage device 1. The controller 23 is, for example, a semiconductor package including a system on a chip (SoC) in which a host interface circuit for the host device, a control circuit for controlling the plurality of DRAMs 24, a control circuit for controlling the plurality of NANDs 25, and the like are integrated on one semiconductor chip. The controller 23 is mounted on the second surface S2 of the board 21, for example.

The DRAM 24 is a semiconductor package that contains volatile semiconductor memory chips. The DRAM 24 is a data buffer that temporarily stores write data received from the host device or read data read from the NAND 25. The DRAM 24 is mounted on the first surface S1 of the board 21, for example. The DRAM 24 may be provided in the controller 23 without being limited to the above example.

The plurality of NANDs 25 are disposed side by side in the X- and Y-directions. The NAND 25 is a semiconductor package including nonvolatile semiconductor memory chips. The NAND 25 is mounted on the first surface S1 and the second surface S2 of the board 21, for example. The NAND 25 is an example of a "semiconductor memory component".

The capacitor 40 has a power backup function of protecting data during unexpected power shutdown. For example, the capacitor 40 supplies power to the controller 23, the plurality of DRAMs 24, and the plurality of NANDs 25 for a period of time when the power supply from the host device is unexpectedly shut down. The capacitor 40 is, for example, an electrolytic capacitor. The capacitor 40 is, for example, an aluminum electrolytic capacitor. However, the capacitor 40 is not limited to the above example. The capacitor 40 is an example of the "electronic component".

The holder 60 is a holding member for holding the capacitor 40. The holder 60 is disposed in the notch 31 of the board 21 and holds the capacitor 40 in the notch 31. Details of the holder 60 will be described later.

2. Mounting Structure of Capacitor

Next, a mounting structure of the capacitor 40 will be described. The mounting structure of the capacitor 40 disposed in the notch 31 adjacent to the first end 21a of the board 21 will be described below as an example. However, the mounting structure described below is also applicable to the capacitor 40 disposed in the notch 31 adjacent to another end (for example, the third end 21c or the fourth end 21d) of the board 21.

Figure 3:
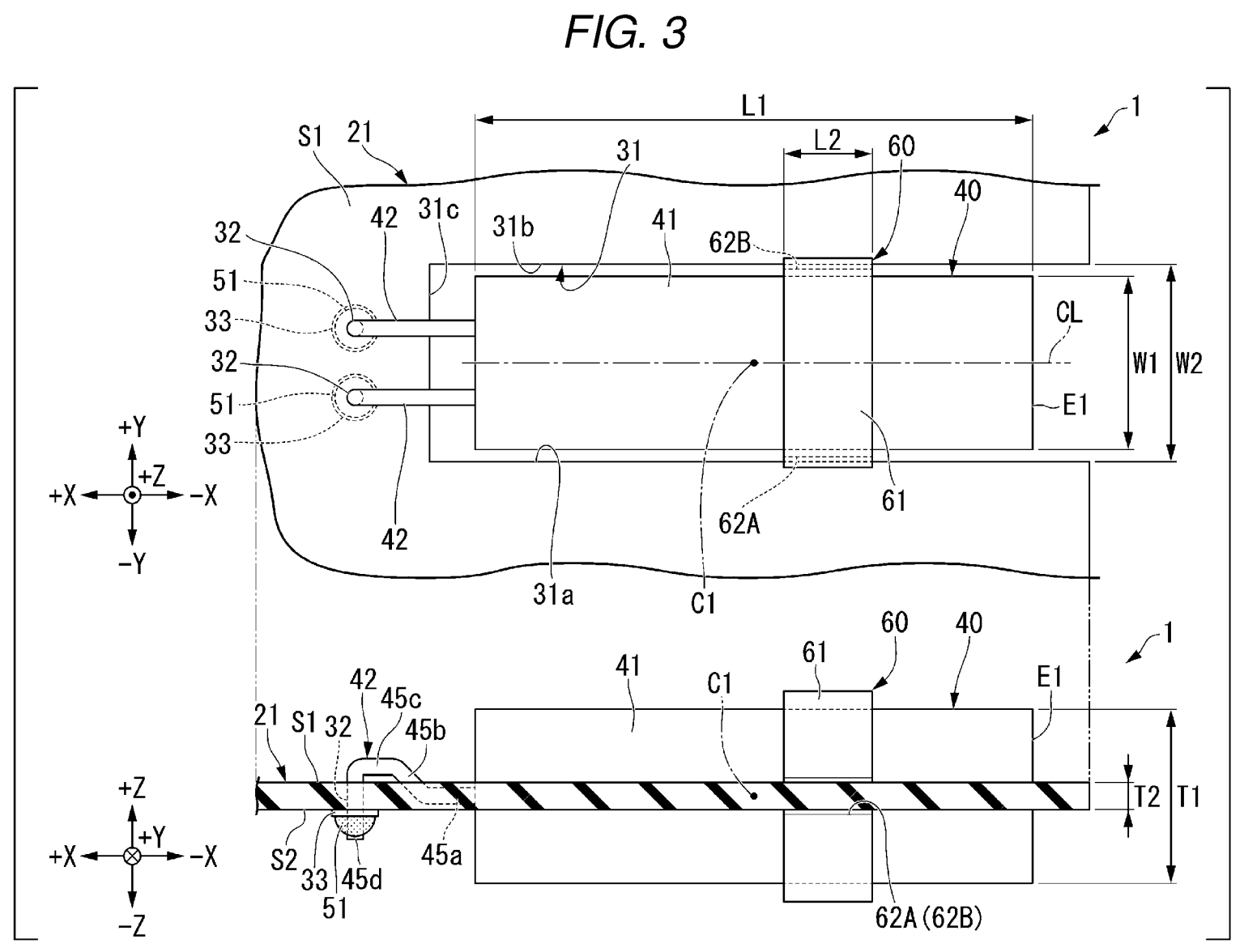

FIG. 3 is a diagram illustrating the mounting structure of the capacitor 40. The semiconductor storage device 1 includes, for example, the board 21, the capacitor 40, a plurality of bonding parts 51, and the holder 60 as a configuration related to the mounting structure of the capacitor 40.

2.1 Board

The board 21 includes the notch 31 for accommodating the capacitor 40, as described above. The notch 31 is provided adjacent to the first end 21a of the board 21. The notch 31 includes, for example, a first edge 31a, a second edge 31b, and a third edge 31c, and one end on the −X-direction side of the notch 31 is open.

The first edge 31a extends in the X-direction, which is the longitudinal direction of the notch 31. The second edge 31b is separated from the first edge 31a in the Y-direction and extends in the X-direction. The first edge 31a and the second edge 31b are parallel to each other. The third edge 31c is positioned at an end of the notch 31 on the +X-direction side. The third edge 31c extends in the Y-direction and connects an end of the first edge 31*a* on the +X-direction side and an end of the second edge 31*b* on the +X-direction side.

The board 21 includes, for example, a plurality of first through-holes 32 and a plurality of lands 33 as a structure for connecting the capacitor 40, which will be described later. The through-holes 32 penetrate through the board 21 in the Z-direction. The through-holes 32 are disposed on the +X-direction side of the notch 31. Leads 42 of the capacitor 40, which will be described later, are inserted into the through-holes 32. Each land 33 is a conductive part provided on the second surface S2 of the board 21. Each land 33 is provided around each through-hole 32.

2.2 Capacitor

Next, the capacitor 40 will be described. The capacitor 40 includes, for example, a component body 41 and the plurality of (for example, two) leads 42.

The component body 41 is a portion that performs a main function of the electronic component. For example, the component body 41 of the capacitor 40 is a portion that accumulates electric charge when a DC voltage is applied. The component body 41 contains, for example, a metal that serves as an electrode, a dielectric, and an electrolytic solution. The component body 41 has, for example, a cylindrical shape with an axis CL along the X-direction. In the embodiment, a length L1 of the component body 41 in the X-direction is larger than a width W1 of the component body 41 in the Y-direction. A width T1 of the component body 41 in the Z-direction is larger than a thickness T2 of the board 21.

In the embodiment, a width W2 of the notch 31 in the Y-direction is larger than the width W1 of the component body 41 in the Y-direction. The component body 41 is disposed in the notch 31 and accommodated in the notch 31. Therefore, the component body 41 does not overlap the board 21 when viewed from the Z-direction. The center C1 of the component body 41 is positioned at the same height as the board 21 in the Z-direction.

Each lead 42 is a terminal for electrical connection. The plurality of leads 42 protrude from the component body 41 in the +X-direction. In the embodiment, each lead 42 includes a first portion 45*a*, a second portion 45*b*, a third portion 45*c*, and a fourth portion 45*d*.

The first portion 45*a* protrudes linearly from the component body 41 in the +X-direction. The first portion 45*a* is positioned at the same height as the board 21 in the Z-direction. The second portion 45*b* extends obliquely with respect to the first surface S1 in the +X direction and the +Z-direction from the end of the first portion 45*a* on the +X-direction side. The third portion 45*c* extends in the +X-direction from the end of the second portion 45*b* on the +X-direction side. The third portion 45*c* extends parallel to the first surface S1 of the board 21. The fourth portion 45*d* is bent in the −Z-direction from the end of the third portion 45*c* on the +X-direction side. The fourth portion 45*d* is inserted into the through-hole 32 of the board 21 and penetrates through the board 21 in the Z-direction. A part of the fourth portion 45*d* protrudes in the −Z-direction from the second surface S2 of the board 21.

2.3 Bonding Part

The bonding part 51 is provided on the land 33 and bonds the fourth portion 45*d* of the lead 42 of the capacitor 40 to the land 33. The bonding part 51 is made of a conductive bonding material (such as solder or conductive paste). In the embodiment, each lead 42 of the capacitor 40 is electrically connected to the wiring pattern of the board 21 via the bonding part 51 and the land 33.

2.4 Holder

Next, the holder 60 will be described. As described above, the holder 60 is disposed in the notch 31 of the board 21 and holds the capacitor 40 in the notch 31. In the embodiment, the holder 60 is attached to the component body 41 of the capacitor 40 and holds the component body 41.

Figures 4, 5:
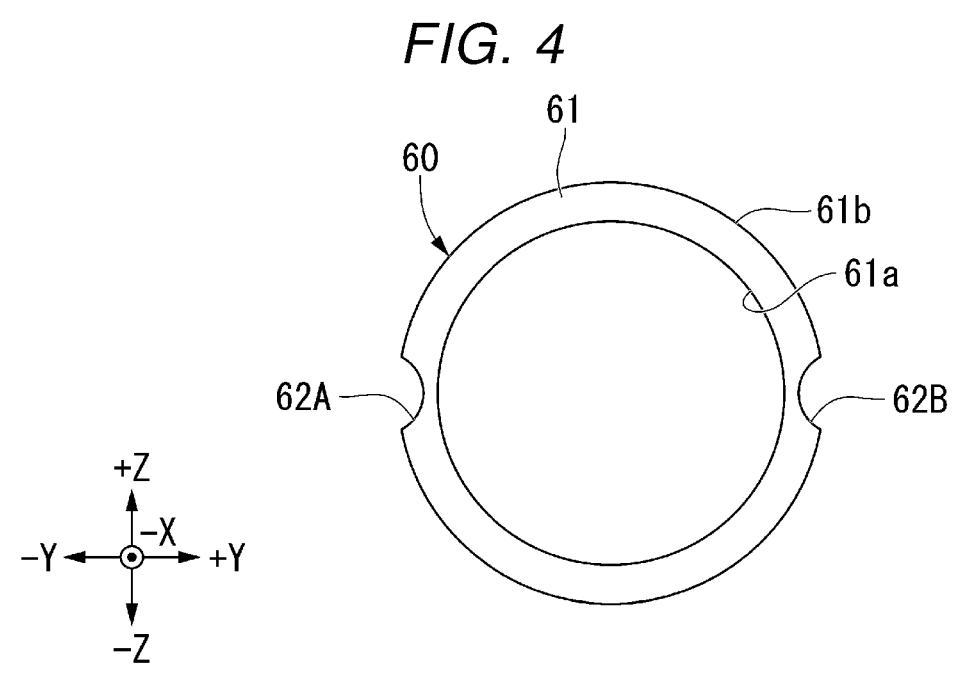
FIG. 4 is a front view illustrating a holder of the first embodiment.
FIG. 5 is a cross-sectional view illustrating the holder attached to a capacitor and a board of the first embodiment.

FIG. 4 is a front view illustrating the holder 60. FIG. 5 is a cross-sectional view illustrating the holder 60 attached to the capacitor 40 and the board 21. The holder 60 includes, for example, a holder body 61, a first groove 62A, and a second groove 62B.

The holder body 61 is a portion that forms a main part of the holder 60 and holds the component body 41 of the capacitor 40. For example, at least a part of the holder body 61 is formed in an annular shape (for example, ring shape), and the component body 41 of the capacitor 40 is inserted in the holder body 61. In the embodiment, the holder body 61 is formed in a ring shape along an outer peripheral surface 41*a* of the component body 41. For example, the holder body 61 includes an inner peripheral surface 61*a* that is in contact with the outer peripheral surface 41*a* of the component body 41.

In the embodiment, an inner diameter of the holder body 61 is the same as or slightly smaller than an outer diameter of the component body 41 of the capacitor 40. The holder body 61 is attached to the outer peripheral surface 41*a* of the component body 41 by, for example, an interference fit, and has frictional resistance with the component body 41. With such configuration, it is difficult for the holder body 61 to become detached from the component body 41, and the position of the holder body 61 in the X-direction is fixed. When sufficient frictional resistance exists between the first groove 62A or the second groove 62B of the holder 60 and the board 21, which will be described later, the frictional resistance between the holder body 61 and the component body 41 is not needed. That is, the inner diameter of the holder body 61 may be larger than the outer diameter of the component body 41 of the capacitor 40.

In the embodiment, a length L2 of the holder body 61 in the X-direction (length L2 of the holder 60 in the X-direction) is shorter than the length L1 of the component body 41 of the capacitor 40 in the X-direction (see FIG. 3). For example, the length L2 of the holder body 61 in the X-direction is shorter than half of the length L1 of the component body 41 in the X-direction. In the embodiment, the holder body 61 is disposed, in the X-direction, in a region between the center C1 of the component body 41 and an end E1 of the component body 41 on the −X-direction side (see FIG. 3).

The holder body 61 is made of, for example, a material having electrical insulating properties. The holder body 61 is made of hard resin, rubber, or ceramic, for example. For example, the holder body 61 is preferably at least slightly elastically deformable.

Next, referring back to FIG. 5, the first groove 62A and the second groove 62B will be described. The first groove 62A is a groove provided on an outer peripheral surface 61*b* of the holder body 61. For example, the first groove 62A is provided at the end of the holder body 61 on the −Y-direction side and is recessed in the +Y-direction. The first groove 62A extends along the X-direction and penetrates through the holder body 61 in the X-direction. The first groove 62A is an arc-shaped notch when viewed from the X-direction. The first groove 62A is engaged with the first edge 31*a* of the notch 31. The first groove 62A is an example of a "first engagement part".

The second groove 62B is a groove provided on the outer peripheral surface 61b of the holder body 61. The second groove 62B is provided at the end of the holder body 61 on the +Y-direction side and is recessed in the −Y-direction. The second groove 62B extends along the X-direction and penetrates through the holder body 61 in the X-direction. The second groove 62B is an arc-shaped notch when viewed from the X-direction. The second groove 62B is engaged with the second edge 31b of the notch 31. The second groove 62B is an example of a "second engagement part".

In the embodiment, the first groove 62A and the second groove 62B are positioned at the same height as the center C2 of the holder 60 in the Z-direction. In other words, the first groove 62A and the second groove 62B are positioned at the same height as the center C1 of the component body 41 of the capacitor 40 in the Z-direction. As a result, in the embodiment, the center C2 of the holder 60 (the center C1 of the component body 41) is positioned at the same height as the board 21 in the Z-direction.

Figure 6:
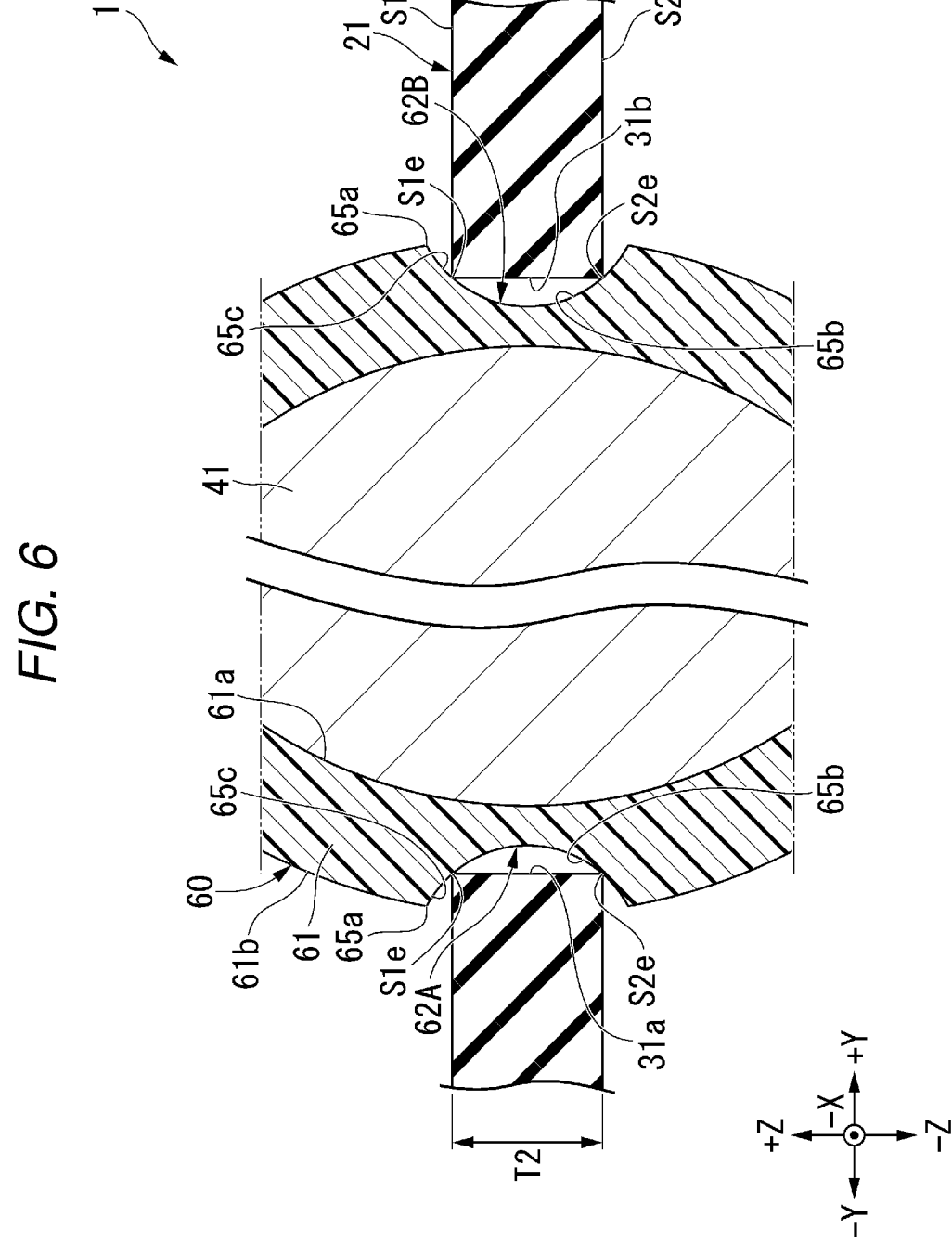
FIG. 6 is a cross-sectional view illustrating an enlarged region of the mounting structure illustrated in FIG. 5.

FIG. 6 is a cross-sectional view illustrating an enlarged region of the mounting structure illustrated in FIG. 5, that is surrounded by F6 line. As described above, each of the first groove 62A and the second groove 62B is an arc-shaped notch. Each of the first groove 62A and the second groove 62B is not limited to an arc-shaped notch, and may have another shape (for example, V-shaped or trapezoidal) that becomes narrower on the +Y-direction side (for the first groove 62A) or the −Y-direction side (for the second groove 62B) when viewed from the X-direction.

For example, each of the first groove 62A and the second groove 62B includes a first portion 65a, a second portion 65b, and a third portion 65c in a cross section along the Y-direction and the Z-direction (that is, the cross section illustrated in FIG. 6). The width of the first portion 65a in the Z-direction is larger than the thickness T2 of the board 21. The width of the second portion 65b in the Z-direction is smaller than the thickness T2 of the board 21. The width of the third portion 65c in the Z-direction gradually decreases from the first portion 65a toward the second portion 65b.

When each of the first groove 62A and the second groove 62B has such a shape, at least one of the first groove 62A and the second groove 62B comes into contact with an edge S1e of the first surface S1 of the board 21 from the +Z-direction side, and easily comes into contact with an edge S2e of the second surface S2 from the −Z-direction side. In other words, at least one of the first groove 62A and the second groove 62B tends to have frictional resistance with the board 21. With such configuration, the holder body 61 is difficult to come off from the notch 31, and the position of the holder body 61 in the X-direction is fixed. As described above, when sufficient frictional resistance exists between the holder body 61 and the component body 41 of the capacitor 40, the frictional resistance between the board 21 and both the first groove 62A and the second groove 62B is not needed. In such a case, each of the first groove 62A and the second groove 62B may be a rectangular groove whose width in the Z-direction is larger than the thickness T2 of the board 21 when viewed from the X-direction.

In the embodiment, the holder 60 is movable to any position in the X-direction along the first edge 31a and the second edge 31b of the notch 31 while the first groove 62A and the second groove 62B are engaged with the first edge 31a and the second edge 31b of the notch 31, respectively, by applying a force for movement by an operator during the assembly work of the semiconductor storage device 1, for example. On the other hand, when the operator releases their hand from the holder 60, the holder 60 does not move in the X-direction due to the frictional resistance between the board 21 and at least one of the first groove 62A and the second groove 62B.

3. Method for Assembling Mounting Structure of Capacitor

Next, an example of a method for assembling the mounting structure of the capacitor 40 will be described. In the embodiment, first, the capacitor 40 is attached to the board 21. That is, the fourth portion 45d of the lead 42 is fixed to the board 21 by inserting the fourth portion 45d of the lead 42 into the through-hole 32 and providing the bonding part 51 on the land 33 of the second surface S2 of the board 21. With such configuration, the capacitor 40 is fixed to the board 21.

Next, the holder 60 is attached to the board 21 and the capacitor 40. For example, the holder 60 is disposed at one open end (end on the −X-direction side) of the notch 31 of the board 21, the first groove 62A and the second groove 62B of the holder 60 are fitted to the first edge 31a and the second edge 31b of the notch 31, and the inner peripheral surface 61a of the holder body 61 is fitted to the outer peripheral surface 41a of the component body 41 of the capacitor 40. While the first groove 62A and the second groove 62B of the holder 60 are engaged with the first edge 31a and the second edge 31b of the notch 31, the holder 60 moves in a sliding manner in the +X-direction (that is, towards the inside of the notch 31).

The holder 60 is stopped, for example, at a position between the center C1 of the component body 41 of the capacitor 40 and the end E1 of the component body 41 on the −X-direction side, in the X-direction. The position of the holder 60 is fixed by frictional resistance between the first edge 31a and the second edge 31b of the notch 31 and the holder body 61 and/or frictional resistance between the component body 41 of the capacitor 40 and the holder body 61. With such configuration, the holder 60 holds the capacitor 40 in the notch 31.

4. Advantage

To miniaturize the semiconductor storage device 1, the board and the capacitor need to be disposed in a limited space in the casing 10. However, when the board and the capacitor are overlapped in the thickness direction of the board, it becomes difficult to reduce the thickness of the casing. Therefore, it is preferable to provide a space part such as a notch or an opening in the board, and locate the component body of the capacitor in the space part.

Here, as a first comparative example, a configuration in which the component body of the capacitor is disposed in a notch of the board by mounting the component body of the capacitor on a dedicated socket and fixing the socket to the board by soldering is considered. In the configuration of the first comparative example, a new socket needs to be prepared each time the length dimension of the capacitor changes. A process of soldering for fixing the socket to the board is needed. Therefore, it may be difficult to improve the degree of freedom in design.

As a second comparative example, a configuration is considered in which the component body of the capacitor is disposed in an opening provided in the board, a cap-shaped holder is pressed against one end of the opening in the longitudinal direction, and the holder wraps and holds one end part of the component body of the capacitor. In the configuration of the second comparative example, the size of the opening in the board needs to be changed each time the length dimension of the capacitor changes. Therefore, it may be difficult to improve the degree of freedom in design.

On the other hand, in the embodiment, the semiconductor storage device 1 includes the board 21, the capacitor 40, and the holder 60. The board 21 includes a space part such as the notch 31. The capacitor 40 includes the component body 41 disposed in the notch 31. The holder 60 is disposed in the notch 31 and holds the component body 41. The notch 31 includes the first edge 31a extending in the X-direction and the second edge 31b separated from the first edge 31a in the Y-direction and extending in the X-direction. The holder 60 includes the holder body 61 at least partially formed in an annular shape and into which the component body 41 is inserted, the first groove 62A provided along the X-direction and engaged with the first edge 31a, and the second groove 62B provided along the X-direction and engaged with the second edge 31b. According to such a configuration, since an attaching position of the holder body 61 with respect to the notch 31 can be adjusted along the first edge 31a and the second edge 31b of the notch 31, even when the length dimension of the capacitor 40 changes, it is possible to cope with the change in the length dimension of the capacitor 40 without changing the notch 31 and the holder 60. Meanwhile, since the attaching position of the holder body 61 with respect to the component body 41 can be adjusted along the outer shape of the component body 41 of the capacitor 40, even when the length dimension of the capacitor 40 changes, it is possible to cope with the change without changing the notch 31 and the holder 60. Therefore, the degree of freedom in designing the semiconductor storage device 1 can be improved.

In the embodiment, the length L2 of the holder 60 in the X-direction is shorter than the length L1 of the component body 41 of the capacitor 40 in the X-direction. According to such a configuration, since the size of the holder 60 is small, the attaching position of the holder body 61 can be easily adjusted. Therefore, the degree of freedom in designing the semiconductor storage device 1 can be further improved.

In the embodiment, the component body 41 of the capacitor 40 has a cylindrical shape. The holder body 61 has a ring shape along the outer peripheral surface of the component body 41. According to such a configuration, the attaching position of the holder body 61 can be easily adjusted along the outer shape of the component body 41 of the capacitor 40. Therefore, the degree of freedom in designing the semiconductor storage device 1 can be further improved.

In the embodiment, the first groove 62A and the second groove 62B are provided at the same position as the center C2 of the holder 60 in the Z-direction. According to such a configuration, a thickness protruding from the board 21 in the +Z-direction and the thickness protruding from the board 21 in the −Z-direction can be made equal in the capacitor 40. With such configuration, the thickness of the semiconductor storage device 1 can be reduced.

In the embodiment, each of the first groove 62A and the second groove 62B includes, in a cross section along the Y-direction and the Z-direction, the first portion 65a whose width in the Z-direction is larger than the thickness T2 of the board 21, the second portion 65b whose width in the Z-direction is smaller than the thickness T2 of the board 21, and the third portion 65c whose width in the Z-direction gradually decreases from the first portion 65a toward the second portion 65b. According to such a configuration, at least one of the first groove 62A and the second groove 62B easily comes into contact with the board 21 from both sides in the +Z-direction and the −Z-direction and tends to have frictional resistance with the board 21. With such configuration, the need to fix the position of the holder 60 by making the holder 60 abut on one end of the notch or the opening in the longitudinal direction is eliminated, and the holder 60 can be disposed at any position in the notch or the opening.

Therefore, the degree of freedom in designing the semiconductor storage device 1 can be further improved.

Modification

Next, a modification of the first embodiment will be described. The modification differs from the first embodiment in that the leads 42 of the capacitor 40 are bonded to pads 35 on the first surface S1 of the board 21. Configurations other than those described below are the same as those of the first embodiment.

Figure 7:
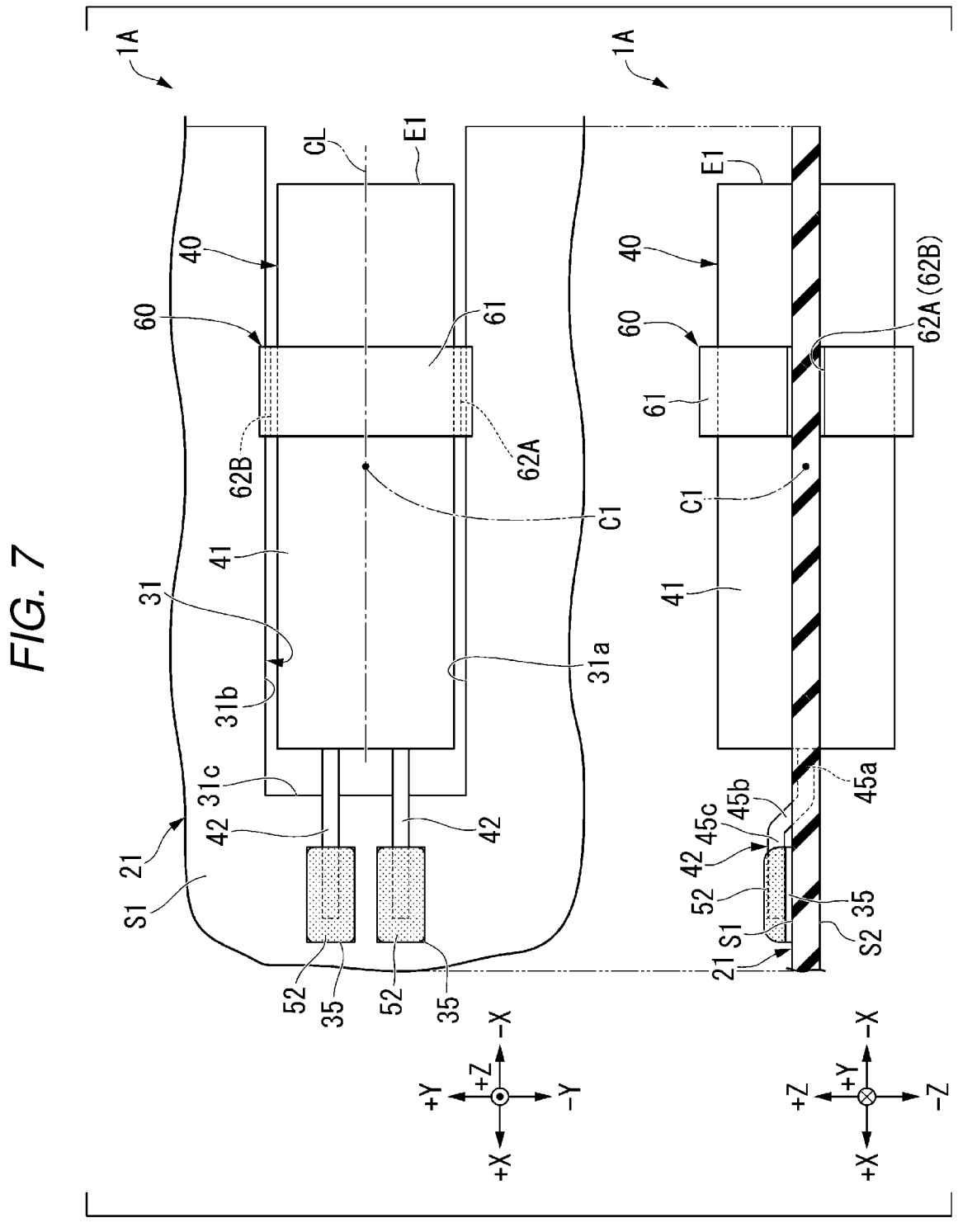
FIG. 7 is a diagram illustrating a mounting structure according to a modification of the first embodiment.

FIG. 7 is a diagram illustrating a mounting structure of the modification of the first embodiment. In the modification, a semiconductor storage device 1A includes, for example, the board 21, the capacitor 40, a plurality of bonding parts 52, and the holder 60 as a configuration related to the mounting structure of the capacitor 40.

The board 21 includes the plurality of pads 35 instead of the plurality of through-holes 32 and the plurality of lands 33 described above. The plurality of pads 35 are provided on the first surface S1 of the board 21. The plurality of pads 35 are disposed on the +X-direction side of the notch 31. Each pad 35 is a conductive part provided on the first surface S1 of the board 21.

Each lead 42 of the capacitor 40 includes the first portion 45a, the second portion 45b, and the third portion 45c. In the modification, the third portion 45c extends parallel to the first surface S1 of the board 21. A part of the third portion 45c overlaps the pad 35 when viewed from the Z-direction.

The bonding part 52 is provided on the pad 35 and bonds the third portion 45c of the lead 42 to the pad 35. The bonding part 52 is made of a conductive bonding material (such as solder or conductive paste). In the modification, the leads 42 of the capacitor 40 are electrically connected to the wiring pattern of the board 21 via the bonding parts 52 and the pads 35.

According to such a configuration, as in the first embodiment, the degree of freedom in design can be improved. In the modification, the third portion 45c of the lead 42 is bonded to the pad 35 on the first surface S1 of the board 21. Therefore, the number of bending processes needed for the leads 42 can be reduced compared to, for example, the first embodiment described above. With such configuration, more parts can be selected, and the degree of freedom in design can be improved.

According to such a configuration, manufacturability of the semiconductor storage device 1A can be improved. For example, the holder 60 is attached to the capacitor 40 before the capacitor 40 is attached to the board 21. While the first groove 62A and the second groove 62B of the holder 60 are engaged with the first edge 31a and the second edge 31b of the notch 31, the capacitor 40 and the holder 60 moves in a sliding manner in the +X-direction (that is, towards the inside of the notch 31). After that, the leads 42 of the capacitor 40 are bonded to the pads 35 of the board 21. According to such an assembly method, when the leads 42 of the capacitor 40 are bonded to the pads 35 of the board 21, the capacitor 40 is held by the holder 60 and stabilized. Therefore, a jig or the like that is needed when attaching the capacitor 40 to the board 21 can be omitted and the manufacturability can be improved.

Second Embodiment

Next, a second embodiment will be described. The second embodiment differs from the first embodiment in that the first groove 62A and the second groove 62B of a holder 60A are provided at positions different with respect to the center C2 of the holder 60A in the Z-direction. Configurations other than those described below are the same as those of the first embodiment.

Figure 8:
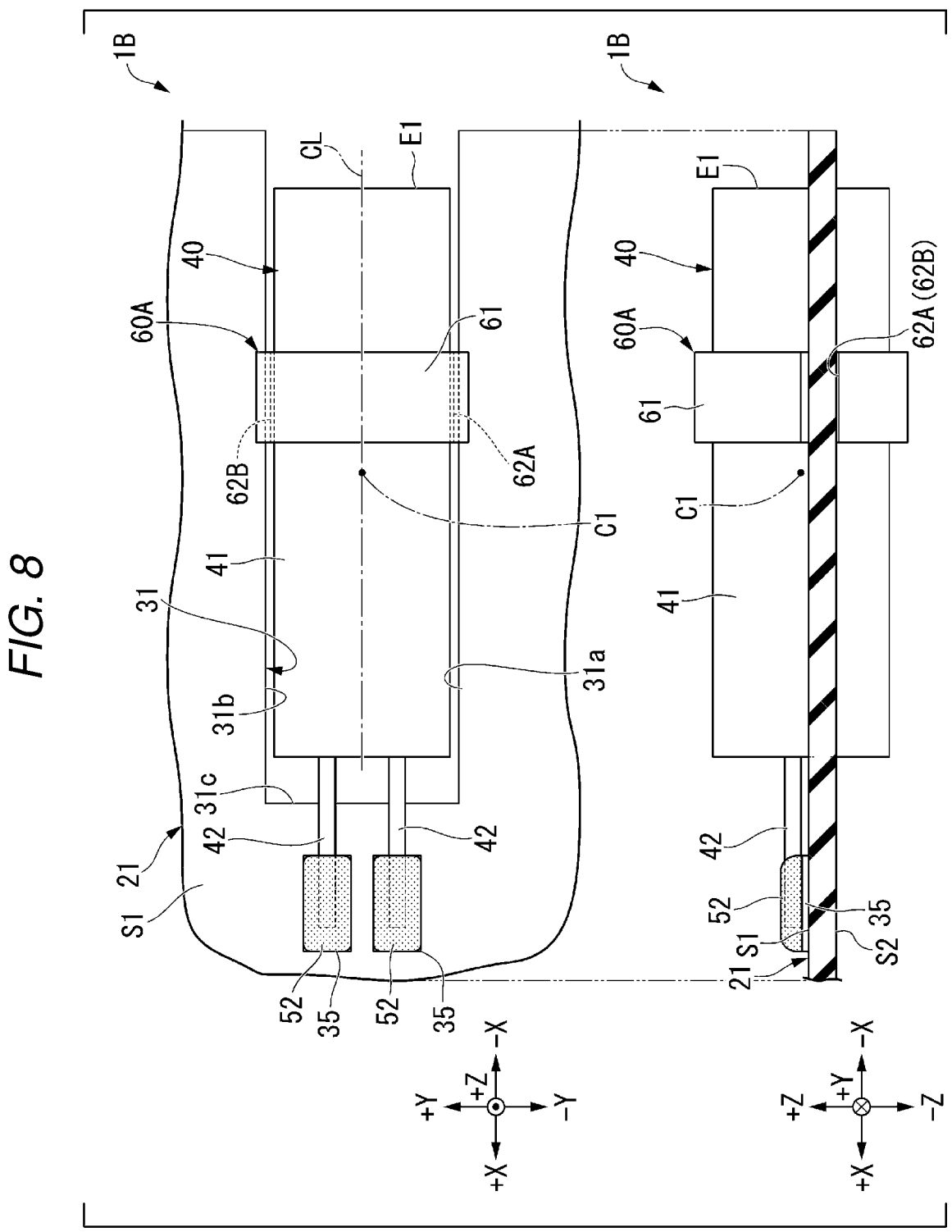
FIG. 8 is a diagram illustrating a mounting structure of a second embodiment.

FIG. 8 is a diagram illustrating a mounting structure of the second embodiment. In the embodiment, a semiconductor storage device 1B includes the board 21, the capacitor 40, the plurality of bonding parts 52, and the holder 60A as a configuration related to the mounting structure of the capacitor 40.

Figure 9:
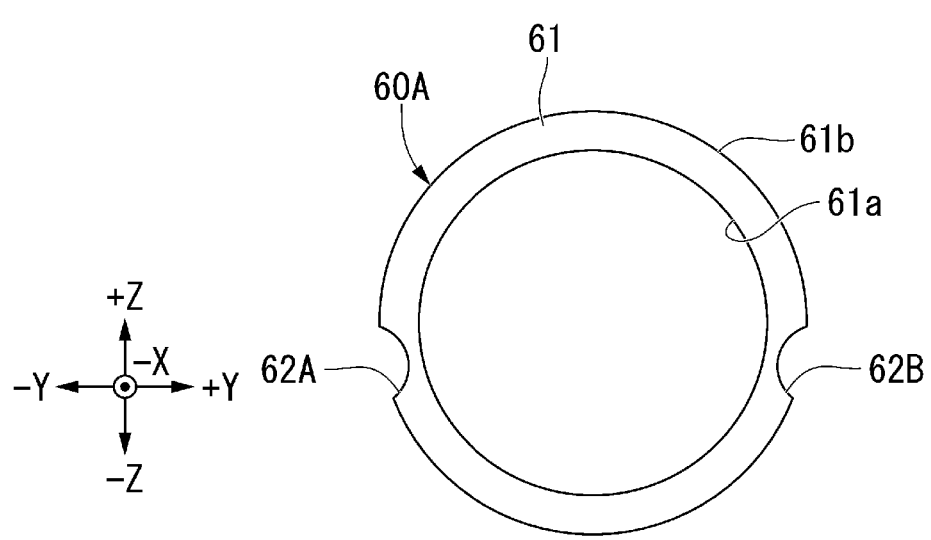
FIG. 9 is a front view illustrating a holder of the second embodiment.
Figure 10:
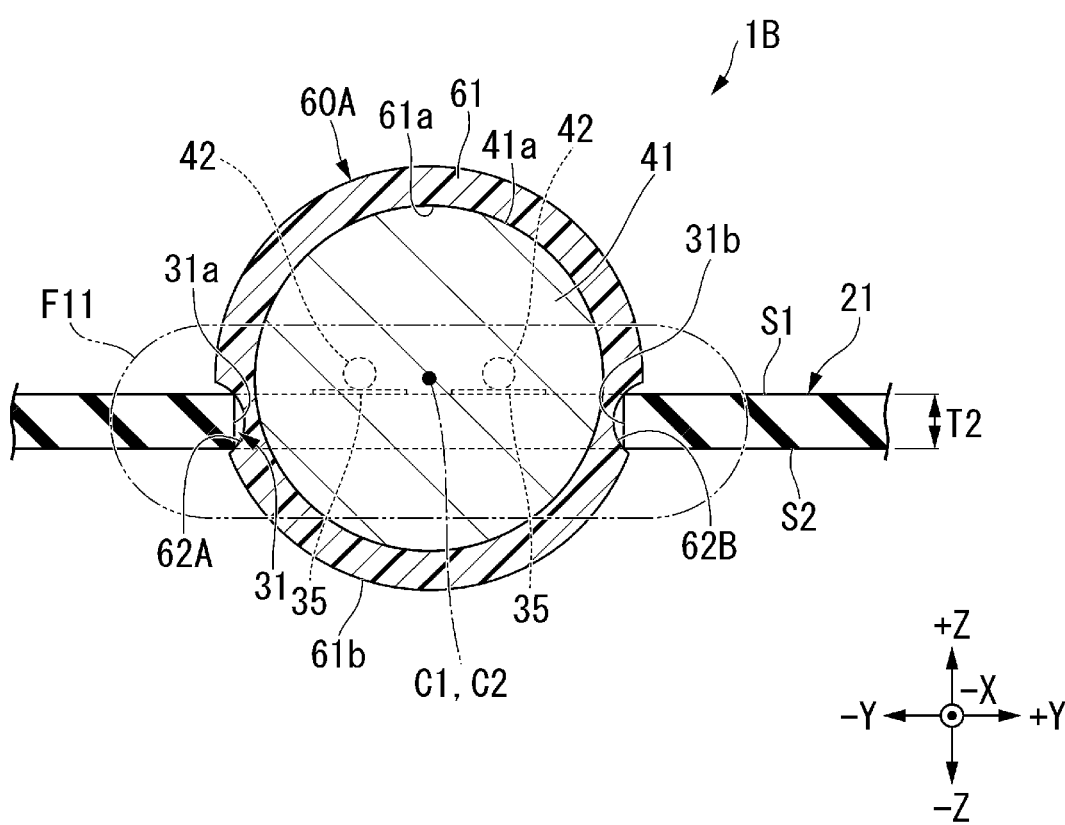
FIG. 10 is a cross-sectional view illustrating the holder attached to a capacitor and a board of the second embodiment.

FIG. 9 is a front view illustrating the holder 60A. FIG. 10 is a cross-sectional view illustrating the holder 60A attached to the capacitor 40 and the board 21. In the embodiment, the holder 60A has an annular shape (for example, ring shape) into which the component body 41 of the capacitor 40 is inserted, as in the first embodiment. The holder 60A includes, for example, the holder body 61, the first groove 62A, and the second groove 62B.

In the embodiment, the first groove 62A and the second groove 62B are positioned at a different height from the height of the center C2 of the holder 60A, in the Z-direction. In other words, the first groove 62A and the second groove 62B are positioned at a different height from the height of the center C1 of the component body 41 of the capacitor 40, in the Z-direction. For example, the first groove 62A and the second groove 62B are provided on the –Z-direction side when viewed from the center C2 of the holder 60A (the center C1 of the component body 41), in the Z-direction.

Figure 11:
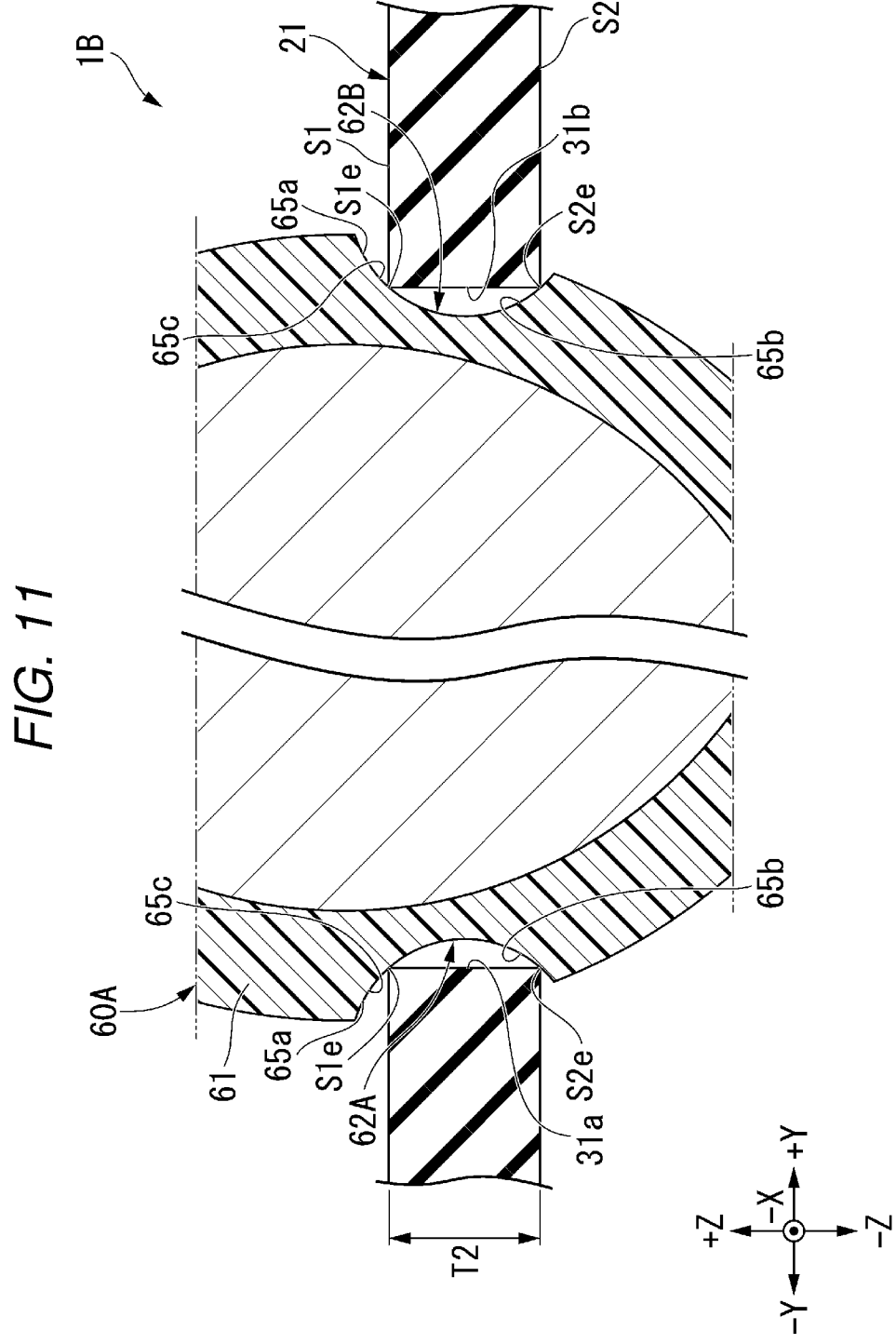
FIG. 11 is a cross-sectional view illustrating an enlarged region of the mounting structure illustrated in FIG. 10.

FIG. 11 is a cross-sectional view illustrating an enlarged region of the mounting structure illustrated in FIG. 10, that is surrounded by F11 line. Each of the first groove 62A and the second groove 62B is an arc-shaped notch. As in the first embodiment, each of the first groove 62A and the second groove 62B is not limited to the arc-shaped notch, and may have another shape (for example, V-shaped or trapezoidal) that becomes narrower on the +Y-direction side (for the first groove 62A) or the –Y-direction side (for the second groove 62B) when viewed from the X-direction. Each of the first groove 62A and the second groove 62B includes the first portion 65a, the second portion 65b, and the third portion 65c as in the first embodiment.

When having such a shape, at least one of the first groove 62A and the second groove 62B comes into contact with the edge S1e of the first surface S1 of the board 21 from the +Z-direction side, and easily comes into contact with the edge S2e of the second surface S2 from the –Z-direction side. In other words, at least one of the first groove 62A and the second groove 62B tends to have frictional resistance with the board 21. With such configuration, it is difficult for the holder body 61 to become detached from the notch 31, and the position of the holder body 61 in the X-direction is fixed.

Referring back to FIG. 8, the leads 42 of the capacitor 40 of the embodiment will be described. In the embodiment, the lead 42 of the capacitor 40 extends linearly from the component body 41 in the +X-direction. A part of the lead 42 overlaps the pad 35 when viewed from the Z-direction. The bonding part 52 is provided on the pad 35 and bonds the lead 42 to the pad 35.

According to such a configuration, as in the first embodiment, the degree of freedom in designing the semiconductor storage device 1B can be improved. In the embodiment, all of the lead 42 extends linearly from the component body 41. Therefore, the number of bending processes needed for the leads 42 can be reduced (for example, eliminated) compared to, for example, the first embodiment described above. With such configuration, more parts can be selected, and the degree of freedom in design can be improved. According to the configuration of the embodiment, for the same reason as the configuration of the modification of the first embodiment, the manufacturability of the semiconductor storage device 1B can be improved.

Third Embodiment

Next, a third embodiment will be described. The third embodiment differs from the first embodiment in that a holder 70 including a cover 71 is provided. Configurations other than those described below are the same as those of the first embodiment.

Figure 12:
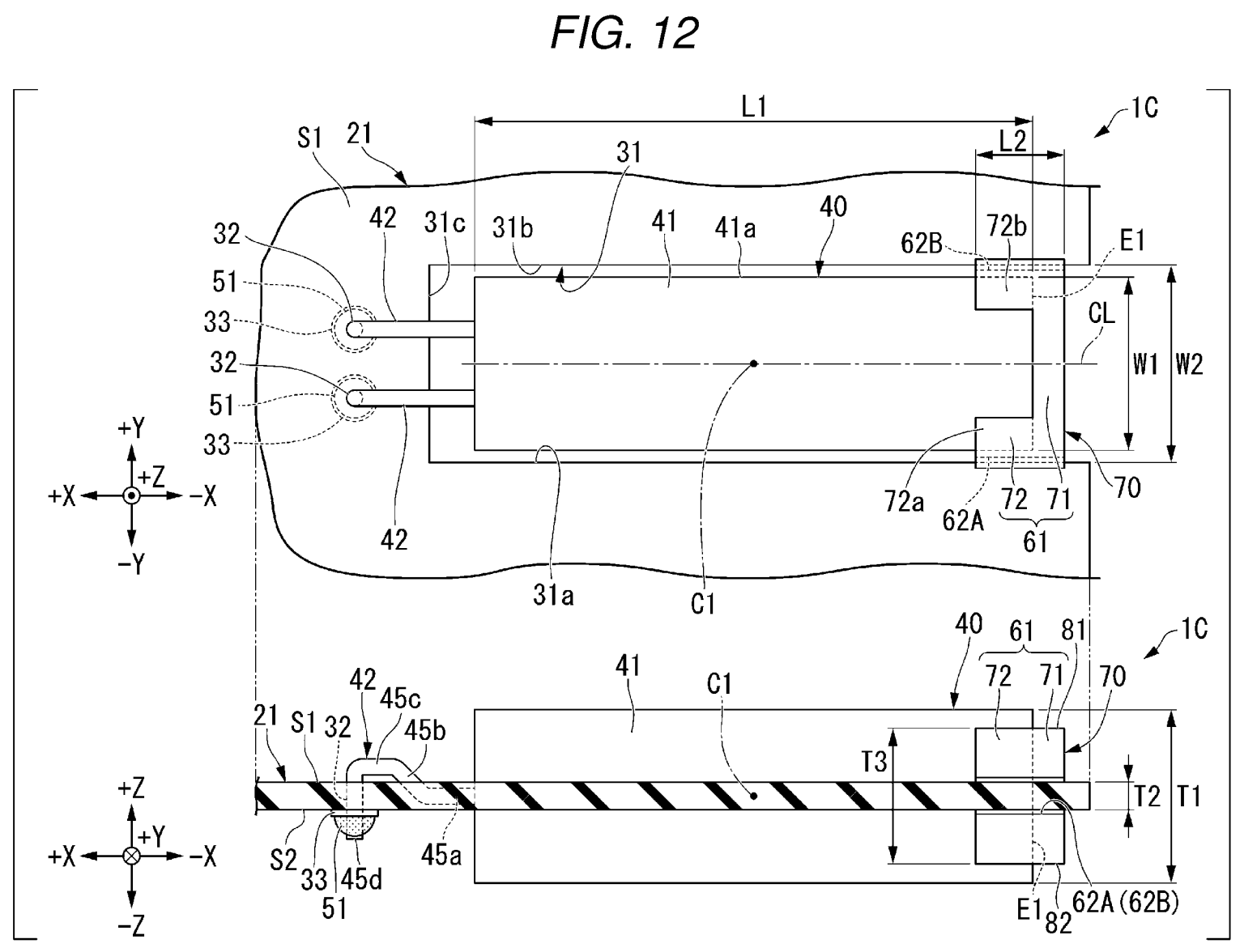

FIG. 12 is a diagram illustrating a mounting structure of the third embodiment. In the embodiment, a semiconductor storage device 1C includes the board 21, the capacitor 40, the plurality of bonding parts 51, and the holder 70 as a configuration related to the mounting structure of the capacitor 40.

In the embodiment, the holder 70 includes the holder body 61, the first groove 62A, and the second groove 62B. In the embodiment, the holder body 61 includes the cover 71 and a holding part 72.

The cover 71 is a plate part along the Y-direction and the Z-direction. The cover 71 is disposed on the –X-direction side of the component body 41 of the capacitor 40. The cover 71 includes a portion that overlaps the component body 41 of the capacitor 40 when viewed from the X-direction. In the embodiment, the cover 71 is in contact with the end E1 of the component body 41 of the capacitor 40 on the –X-direction side.

The holding part 72 is a portion that holds the component body 41 of the capacitor 40. The holding part 72 extends along at least a part of the outer shape of the component body 41 (for example, the outer peripheral surface 41a) from a peripheral end part of the cover 71 and holds the component body 41 in the Y-direction.

Figure 13:
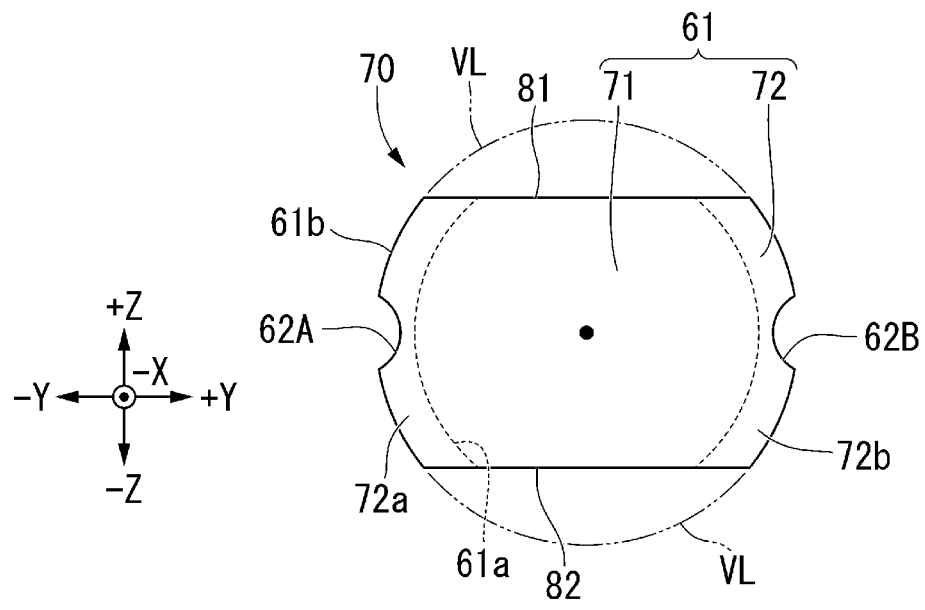
FIG. 13 is a front view illustrating a holder of the third embodiment.
Figure 14:
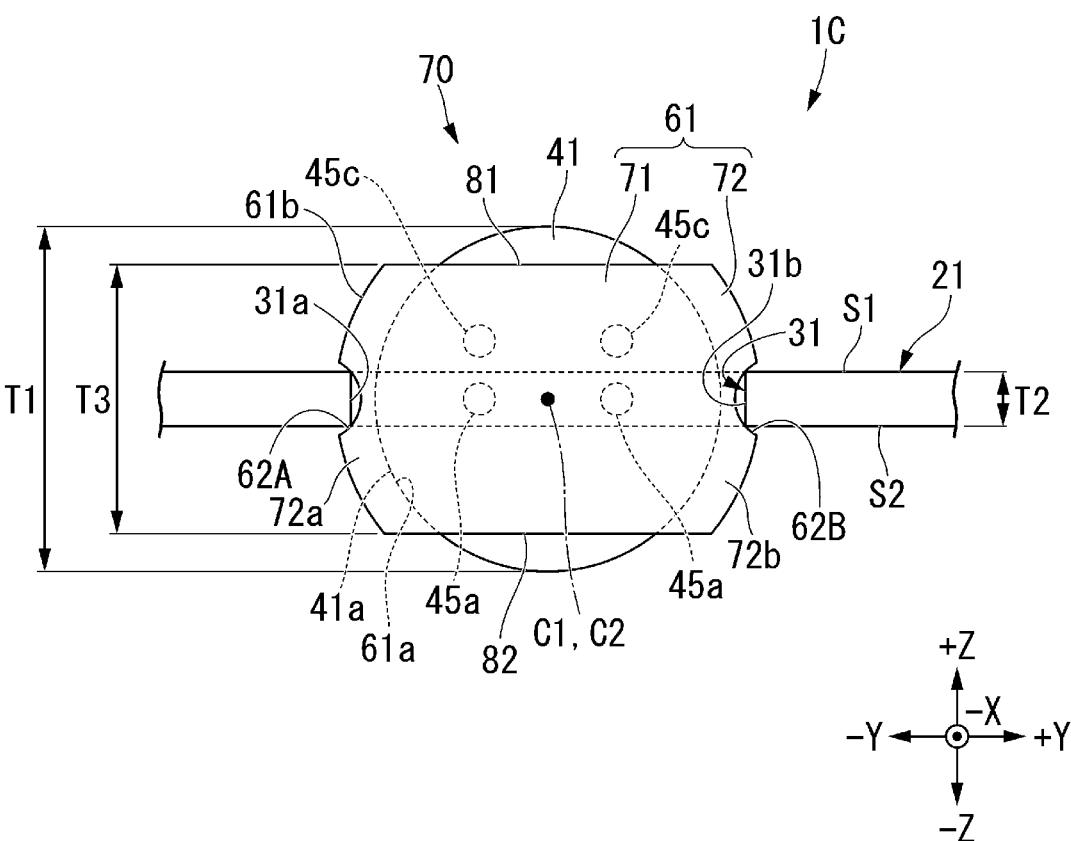
FIG. 14 is a front view illustrating the holder attached to a capacitor and a board of the third embodiment.

FIG. 13 is a front view illustrating the holder 70. FIG. 14 is a front view illustrating the holder 70 attached to the capacitor 40 and the board 21. In the embodiment, the holding part 72 includes a first circular arc part 72a and a second circular arc part 72b. The first circular arc part 72a is disposed on the –Y-direction side of the component body 41 of the capacitor 40. The second circular arc part 72b is disposed on the +Y-direction side of the component body 41 of the capacitor 40. Each of the first circular arc part 72a and the second circular arc part 72b includes the arc-shaped inner peripheral surface 61a along the outer peripheral surface 41a of the component body 41. In the embodiment, the component body 41 of the capacitor 40 is disposed between the first circular arc part 72a and the second circular arc part 72b, and is held by being supported by the first circular arc part 72a and the second circular arc part 72b from both sides in the Y-direction.

In the embodiment, the holder body 61 includes a first flat part 81 and a second flat part 82. The first flat part 81 is provided at an end of the holder body 61 on the +Z-direction side. The first flat part 81 includes a plane along the X-direction and the Y-direction. When a virtual line VL having the same curvature as the outer peripheral surface 61b of the first circular arc part 72a is prescribed between the first circular arc part 72a and the second circular arc part 72b, the first flat part 81 is positioned closer to the center C2 of the holder 70 than the virtual line VL (sec FIG. 13). By providing the first flat part 81, the width of the holder body 61 in the Z-direction becomes smaller than a case where the first flat part 81 does not exist (when the holder body 61 has a ring shape).

Similarly, the second flat part 82 is provided at an end of the holder body 61 on the −Z-direction side. The second flat part 82 includes the plane along the X-direction and the Y-direction. When the virtual line VL having the same curvature as the outer peripheral surface 61*b* of the first circular arc part 72*a* is prescribed between the first circular arc part 72*a* and the second circular arc part 72*b*, the second flat part 82 is positioned closer to the center C2 of the holder 70 than the virtual line VL. By providing the second flat part 82, the width of the holder body 61 in the Z-direction becomes smaller than a case where the second flat part 82 does not exist (when the holder body 61 has the ring shape).

Each of the first flat part 81 and the second flat part 82 is provided across the cover 71 and the holding part 72 of the holder body 61. In the embodiment, a width T3 of the holder body 61 in the Z-direction (a width T3 of the holder 70 in the Z-direction) is smaller than the width T1 of the component body 41 of the capacitor 40 in the Z-direction.

According to such a configuration, as in the first embodiment, the degree of freedom in designing the semiconductor storage device 1C can be improved. In the embodiment, the holder 70 includes the cover 71 that includes a portion overlapping the component body 41 of the capacitor 40 when viewed from the X-direction and the holding part 72 that extends from the cover 71 along at least part of the outer shape of the component body 41 and holds the component body 41 in the Y-direction. According to such a configuration, by making the cover 71 abut on the component body 41 of the capacitor 40, the holder 70 can be easily positioned in the X-direction. With such configuration, the manufacturability of the semiconductor storage device 1C can be improved.

In the embodiment, the width T3 of the holder 70 in the Z-direction is smaller than the width T1 of the component body 41 of the capacitor 40 in the Z-direction. According to such a configuration, even when the holder 70 is provided, it becomes easy to effectively utilize the internal space of the casing 10 based on the width T1 of the capacitor 40 in the Z-direction. As a result, for example, a capacity of the semiconductor storage device 1C can be increased.

Fourth Embodiment

Next, a fourth embodiment will be described. The fourth embodiment differs from the third embodiment in that the leads 42 of the capacitor 40 are disposed separately on both sides of the board 21. Configurations other than those described below are the same as those of the third embodiment.

Figure 15:
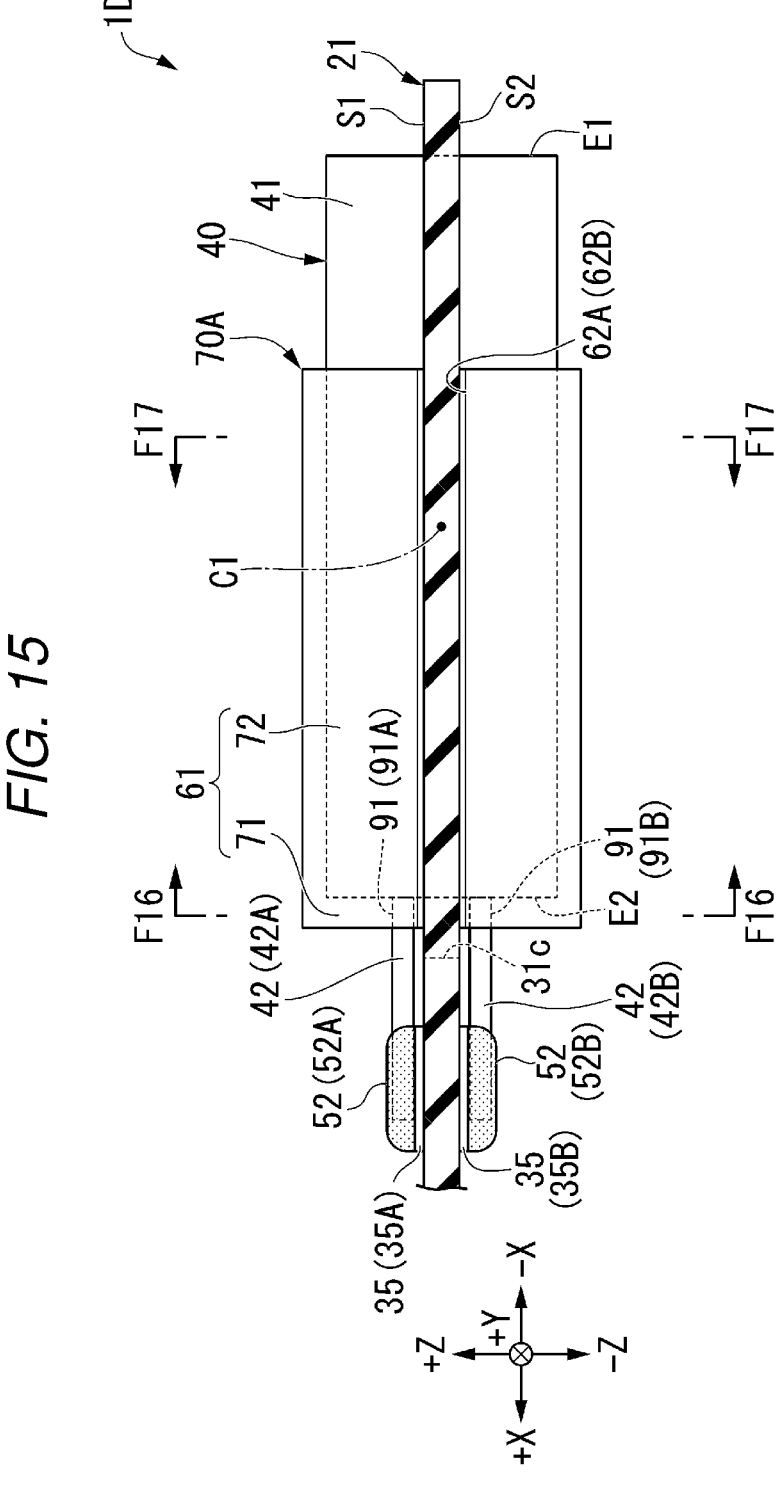
FIG. 15 is a diagram illustrating a mounting structure of a fourth embodiment.

FIG. 15 is a diagram illustrating a mounting structure of the fourth embodiment. In the embodiment, a semiconductor storage device 1D includes the board 21, the capacitor 40, the plurality of bonding parts 52, and a holder 70A as a configuration related to the mounting structure of the capacitor 40.

In the embodiment, the plurality of pads 35 of the board 21 include a first pad 35A and a second pad 35B. The first pad 35A is provided on the first surface S1 of the board 21. The second pad 35B is provided on the second surface S2 of the board 21. The first pad 35A and the second pad 35B are disposed at different positions in the Y-direction (see FIG. 17).

In the embodiment, the plurality of leads 42 of the capacitor 40 include a first lead 42A and a second lead 42B. The first lead 42A and the second lead 42B are disposed separately on both sides of the board 21 in the Z-direction.

Each of the first lead 42A and the second lead 42B linearly extends from the component body 41 in the +X-direction.

The first lead 42A is positioned closer to the +Z-direction side than the first surface S1 of the board 21. A part of the first lead 42A overlaps the first pad 35A when viewed from the Z-direction. The second lead 42B is positioned closer to the −Z-direction side than the second surface S2 of the board 21. A part of the second lead 42B overlaps the second pad 35B when viewed from the Z-direction.

The plurality of bonding parts 52 include a first bonding part 52A and a second bonding part 52B. The first bonding part 52A is provided on the first pad 35A and bonds the first lead 42A to the first pad 35A. The second bonding part 52B is provided on the second pad 35B and bonds the second lead 42B to the second pad 35B.

The holder 70A includes the holder body 61, the first groove 62A, and the second groove 62B. In the embodiment, the holder body 61 includes the cover 71 and the holding part 72.

In the embodiment, the cover 71 is disposed on the +X-direction side of the component body 41 of the capacitor 40. That is, the cover 71 is positioned between the end E1 of the component body 41 on the −X-direction side and the third edge 31*c* of the notch 31. In the embodiment, the cover 71 is in contact with an end E2 of the component body 41 on the +X-direction side.

Figure 16:
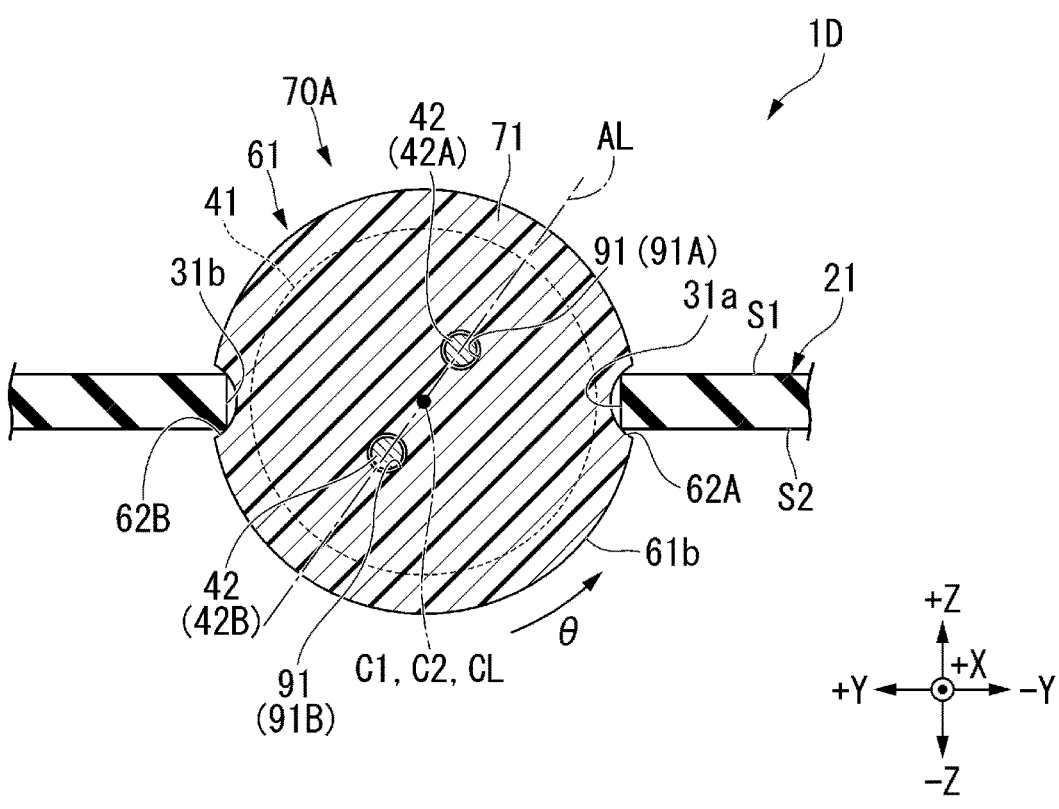
FIG. 16 is a cross-sectional view of the mounting structure illustrated in FIG. 15 taken along line F16-F16.

FIG. 16 is a cross-sectional view of the mounting structure illustrated in FIG. 15 taken along line F16-F16. In the embodiment, the cover 71 includes a plurality of through-holes 91 through which the plurality of leads 42 of the capacitor 40 are passed. The through-holes 91 penetrate through the cover 71 in the X-direction. The plurality of through-holes 91 include a first through-hole 91A and a second through-hole 92B. The first through-hole 91A is provided at a position corresponding to the first lead 42A, and the first lead 42A is passed therethrough. The second through-hole 92B is provided at a position corresponding to the second lead 42B, and the second lead 42B is passed therethrough. By passing the plurality of leads 42 through the plurality of through-holes 91, the positions of the component body 41 and the holder 70A in a circumferential direction θ are fixed. The circumferential direction θ is a direction of rotation about the axis CL.

In the embodiment, a direction in which the first groove 62A and the second groove 62B are arranged (Y-direction) is different from a direction in which the plurality of through-holes 91 are arranged (a direction along line AL in FIG. 16). In other words, a line AL connecting the plurality of through-holes 91 is inclined with respect to the Y-direction. By providing the through-holes 91 in such an arrangement, the first lead 42A and the second lead 42B are disposed in the vicinity of the first pad 35A and the second pad 35B, respectively, in the Z-direction (see FIG. 17).

Figure 17:
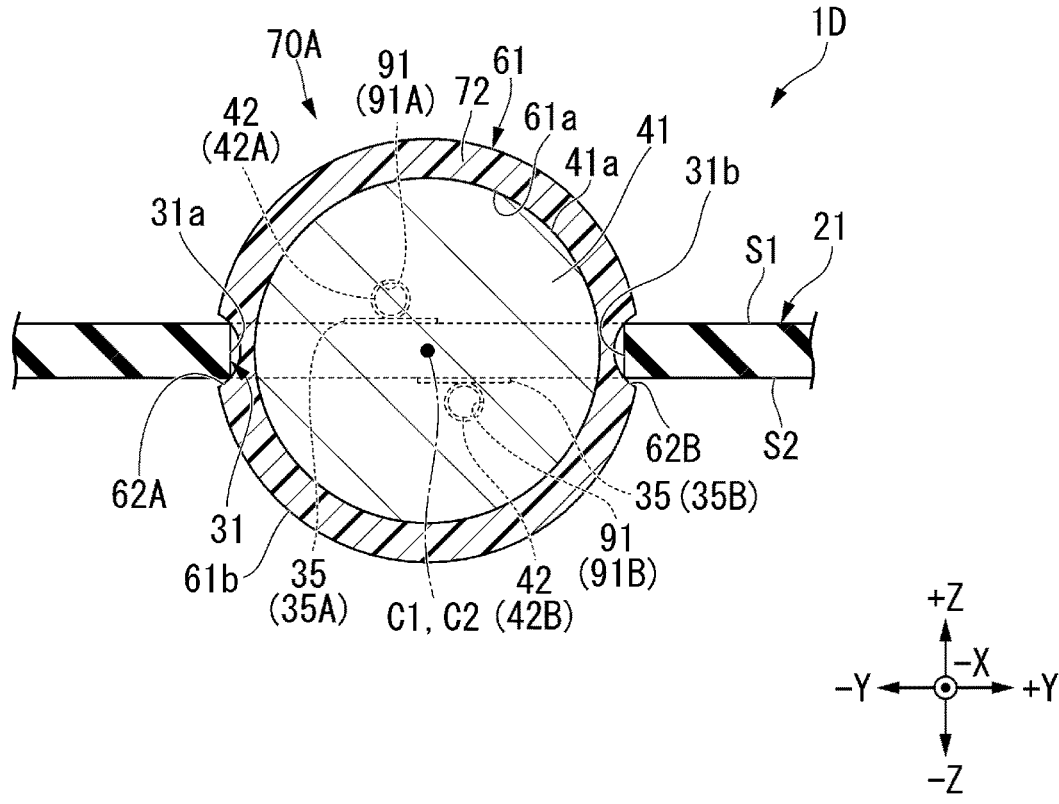
FIG. 17 is a cross-sectional view of the mounting structure illustrated in FIG. 15 taken along line F17-F17.

FIG. 17 is a cross-sectional view of the mounting structure illustrated in FIG. 15 taken along line F17-F17. In the embodiment, the holding part 72 has a cylindrical shape along the outer peripheral surface 41*a* of the component body 41 of the capacitor 40. At least a part of the holding part 72 is disposed in a region between the center C1 of the component body 41 and the end E1 of the component body 41 on the −X-direction side (see FIG. 15).

According to such a configuration, as in the first embodiment, the degree of freedom in designing the semiconductor storage device 1D can be improved. In the embodiment, the board 21 includes the first surface S1 on which the first pad 35A is provided and the second surface S2 which is positioned on a side opposite to the first surface S1 and on which the second pad 35B is provided. The plurality of leads 42 of the capacitor 40 include the first lead 42A bonded to the first pad 35A and the second lead 42B bonded to the second pad 35B. According to such a configuration, by locating the center C1 of the component body 41 of the capacitor 40 at the same height as the board 21, a thickness protruding from the board 21 in the +Z-direction and the thickness protruding from the board 21 in the −Z-direction can be made equal in the capacitor 40, and the number of bending processes needed for the plurality of leads 42 can be reduced (for example, eliminated). With such configuration, the thickness of the semiconductor storage device 1D can be reduced and the manufacturability thereof can be improved.

In the embodiment, the cover 71 includes the plurality of through-holes 91 through which the plurality of leads 42 are passed. The direction in which the first groove 62A and the second groove 62B are arranged is different from the direction in which the plurality of through-holes 91 are arranged. According to such a configuration, by engaging the first edge 31a and the second edge 31b of the notch 31 with the first groove 62A and the second groove 62B, respectively, the plurality of leads 42 can be positioned with the direction in which the plurality of leads 42 are arranged being inclined with respect to the board 21. With such configuration, the work of bonding the plurality of leads 42 to the plurality of pads 35 is facilitated. Therefore, the manufacturability of the semiconductor storage device 1D can be further improved.

Fifth Embodiment

Next, a fifth embodiment will be described. The fifth embodiment differs from the fourth embodiment in that the holder 70A includes the first flat part 81 and the second flat part 82. Configurations other than those described below are the same as those of the fourth embodiment.

Figure 18:
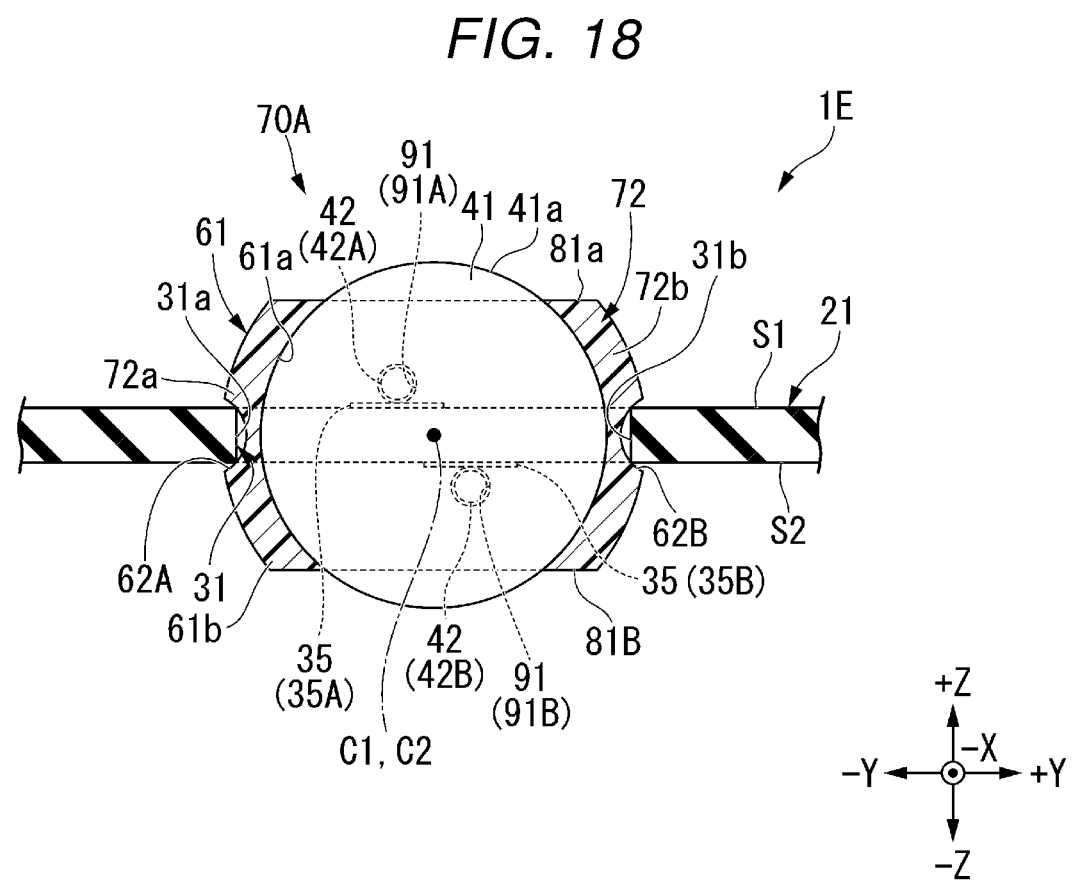

FIG. 18 is a diagram illustrating a mounting structure of the fifth embodiment. In the embodiment, a semiconductor storage device 1E includes the board 21, the capacitor 40, the plurality of bonding parts 52, and the holder 70A as a configuration related to the mounting structure of the capacitor 40.

In the embodiment, the cover 71 of the holder 70A includes the plurality of through-holes 91 as in the fourth embodiment. The holder body 61 of the holder 70A includes the first flat part 81 and the second flat part 82, as in the third embodiment.

According to such a configuration, as in the first embodiment, the degree of freedom in designing the semiconductor storage device 1E can be improved. According to the configuration of the embodiment, as in the third and fourth embodiments, it becomes easy to effectively utilize the internal space of the casing 10 of the semiconductor storage device 1E. As a result, for example, the capacity of the semiconductor storage device 1E can be increased. According to the configuration of the embodiment, as in the fourth embodiment, the manufacturability of the semiconductor storage device 1E can be improved.

Sixth Embodiment

Next, a sixth embodiment will be described. The sixth embodiment differs from the first embodiment in that the board 21 includes an opening 101 instead of the notch 31. Configurations other than those described below are the same as those of the first embodiment.

Figure 19:
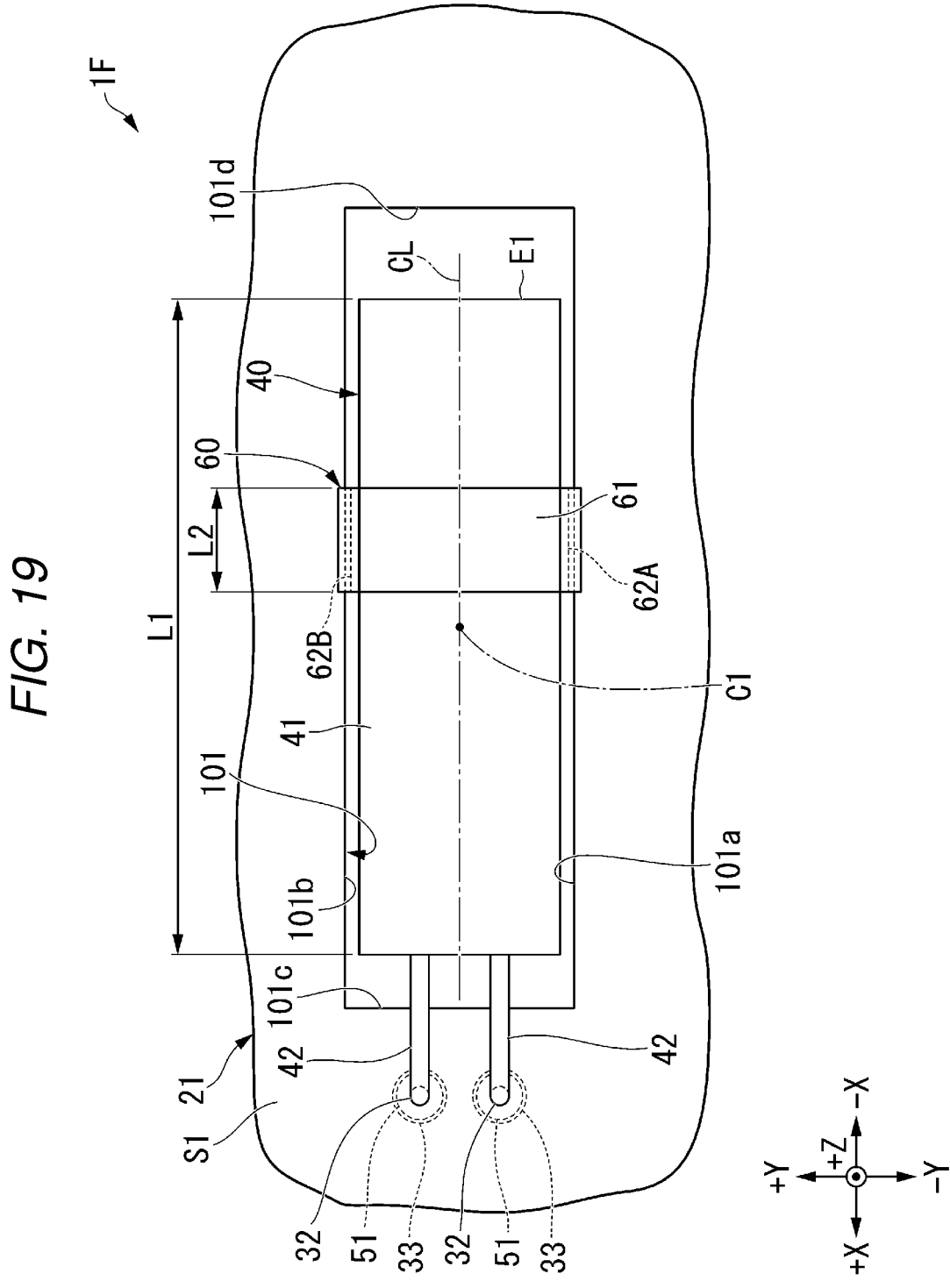
FIG. 19 is a diagram illustrating a mounting structure of a sixth embodiment.

FIG. 19 is a diagram illustrating a mounting structure of the sixth embodiment. In the embodiment, a semiconductor storage device 1F includes the board 21, the capacitor 40, the plurality of bonding parts 51, and the holder 60 as a configuration related to the mounting structure of the capacitor 40.

In the embodiment, the board 21 includes the opening 101 instead of the notch 31. The opening 101 is an example of the "space part". The opening 101 penetrates through the board 21 in the Z-direction. The opening 101 has a rectangular shape, for example. The longitudinal direction of the opening 101 is along the X-direction, for example.

The opening 101 includes, for example, a first edge 101a, a second edge 101b, a third edge 101c, and a fourth edge 101d. The first edge 101a extends in the X-direction, which is the longitudinal direction of the opening 101. The second edge 101b is separated from the first edge 101a in the Y-direction and extends in the X-direction. The first edge 101a and the second edge 101b are parallel to each other. The third edge 101c is positioned at an end of the opening 101 on the +X-direction side. The third edge 101c extends in the Y-direction and connects an end of the first edge 101a on the +X-direction side and an end of the second edge 101b on the +X-direction side. The fourth edge 101d is positioned at an end of the opening 101 on the −X-direction side. The fourth edge 101d extends in the Y-direction and connects an end of the first edge 101a on the −X-direction side and an end of the second edge 101b on the −X-direction side.

In the embodiment, the first groove 62A of the holder 60 is engaged with the first edge 101a of the opening 101. The second groove 62B of the holder 60 is engaged with the second edge 101b of the opening 101. The holder 60 is movable to any position in the X-direction along the first edge 101a and the second edge 101b of the opening 101 while the first groove 62A and the second groove 62B are engaged with the first edge 101a and the second edge 101b of the opening 101, respectively, by applying a force for movement by an operator during the assembly work of the semiconductor storage device 1F, for example. On the other hand, when the operator releases their hand from the holder 60, the holder 60 does not move in the X-direction due to the frictional resistance between the board 21 and at least one of the first groove 62A and the second groove 62B.

Figure 20:
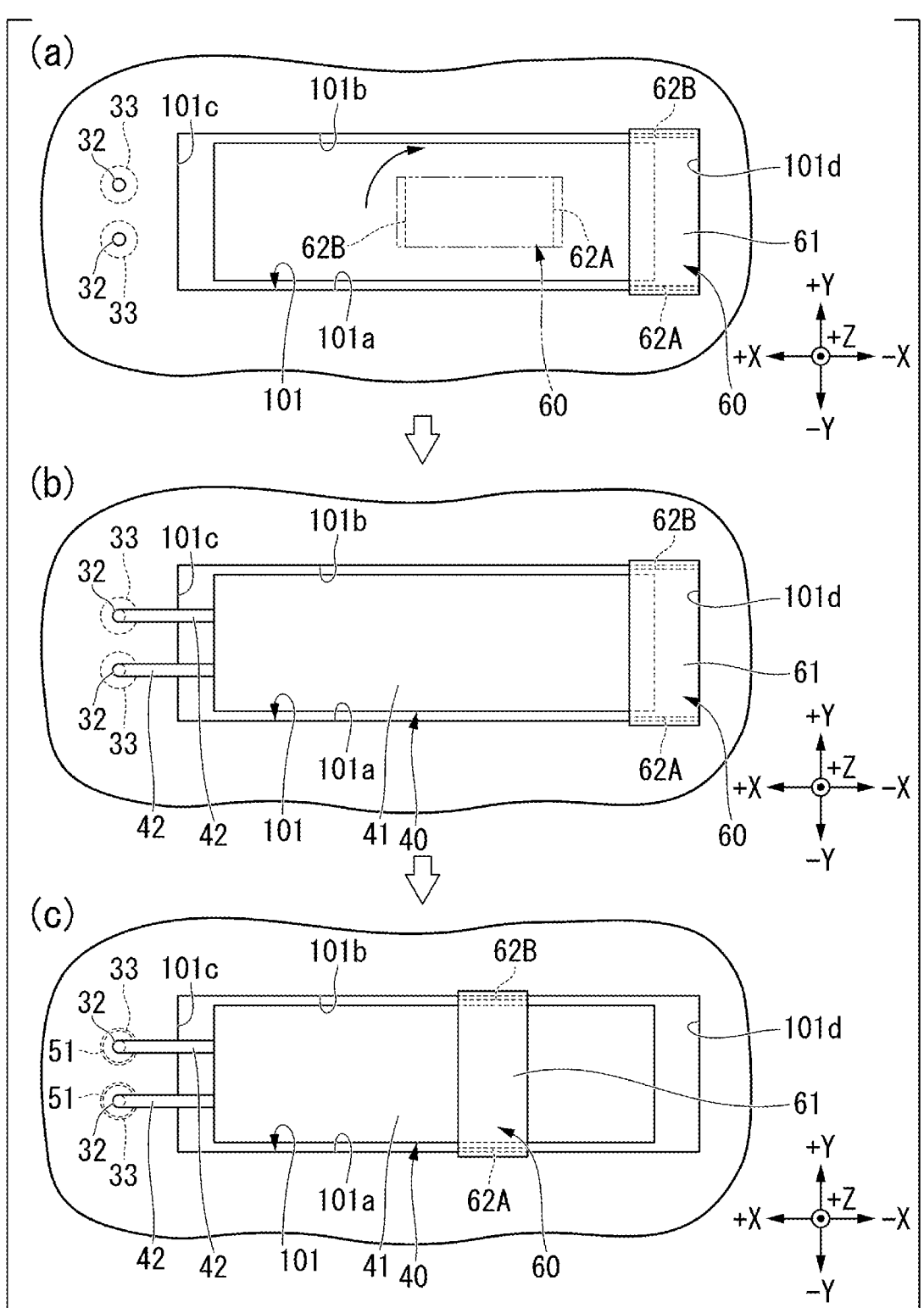
FIG. 20 is a diagram illustrating an example of a method for assembling the mounting structure of the sixth embodiment.

FIG. 20 is a diagram illustrating an example of a method for assembling a mounting structure of the sixth embodiment. For example, first, the holder 60 is passed through the inside of the opening 101 and the orientation of the holder 60 is changed so that the first groove 62A and the second groove 62B of the holder 60 are engaged with the first edge 101a and the second edge 101b of the opening 101, respectively (see (a) in FIG. 20).

Next, the capacitor 40 is mounted on the board 21 while the holder 60 is placed at an end of the opening 101 in the −X-direction. Specifically, the leads 42 of the capacitor 40 are inserted into the through-holes 32 of the board 21 and bonded to the lands 33 by the bonding parts 51 (sec (b) in FIG. 20). Here, an end part of the component body 41 of the capacitor 40 may or may not be inserted into the inside of the holder 60.

Next, while the first groove 62A and the second groove 62B of the holder 60 are engaged with the first edge 101a and the second edge 101b of the opening 101, respectively, the attaching position of the holder 60 is adjusted while moving the holder 60 in the −X-direction and passing the component body 41 of the capacitor 40 in the ring-shaped holder body 61. With such configuration, assembly of the mounting structure of the capacitor 40 is completed.

According to such a configuration, as in the first embodiment, the degree of freedom in designing the semiconductor storage device 1F can be improved. The embodiment may be practiced by being combined with any one of the second to fifth embodiments instead of the first embodiment.

Modification of Embodiments

Figure 21:
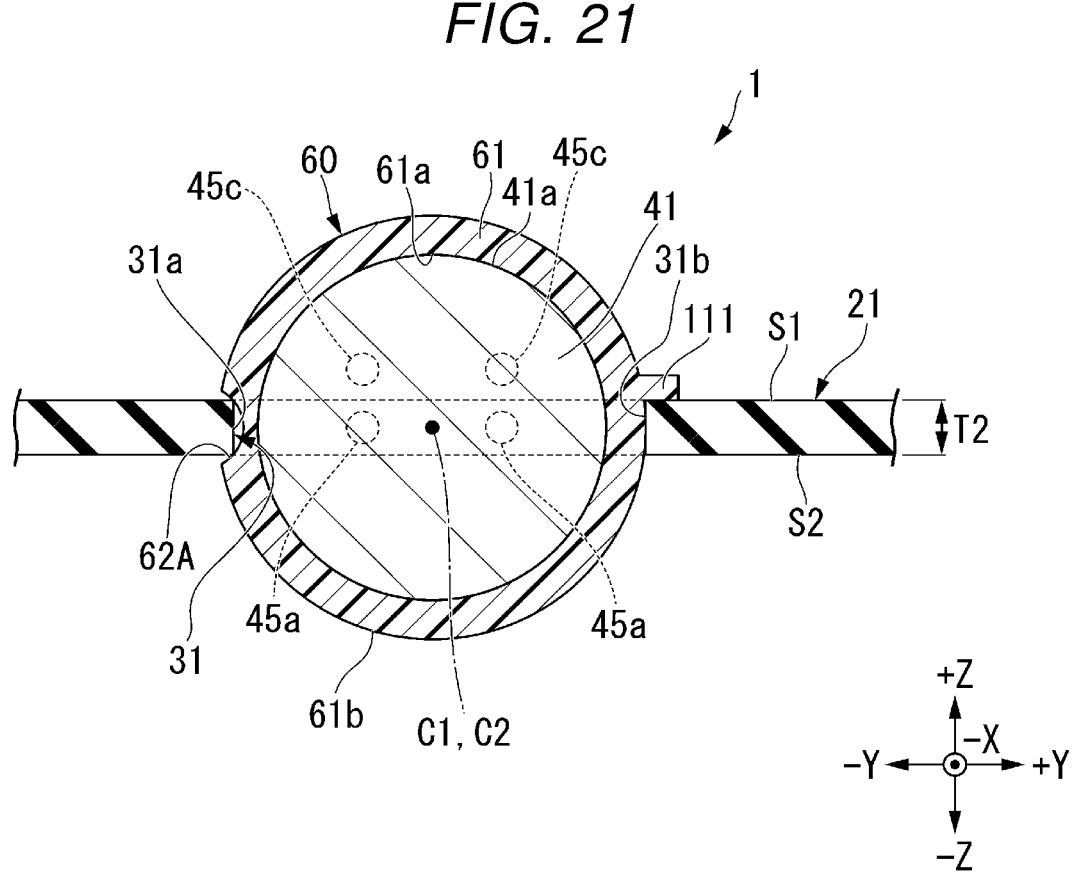
FIG. 21 is a diagram illustrating a mounting structure according to a modification of the first to sixth embodiments.

FIG. 21 is a diagram illustrating a mounting structure of the modification. In the modification, the holder 60 includes a protrusion 111 instead of the second groove 62B. The protrusion 111 is engaged with, for example, the second edge 31*b* of the notch 31 by abutting on the second edge 31*b* from the +Z-direction side. The protrusion 111 is an example of an "engagement part". The modification may be practiced by being combined with any one of the second to sixth embodiments instead of the first embodiment.

According to at least one embodiment described above, the holder includes the holder body at least partially formed in an annular shape and into which the component body of the electronic component is inserted, the first groove provided along the first direction and engaged with the first edge of the space part, and the second groove provided along the first direction and engaged with the second edge of the space part. According to such a configuration, the degree of freedom in design can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a board having a region with an opening;
an electronic component including a component body having a columnar shape, disposed in the opening and a lead protruding from the component body and connected to the board; and
a holder disposed in the opening and supporting the component body, wherein
the region includes first and second edges on either side of the opening, the first and second edges extending along a first direction and separated from each other in a second direction crossing the first direction, and
the holder includes a holder body at least partially formed in an annular shape and into which the component body is inserted, a first groove extending along the first direction and engaged with the first edge, and a second groove extending along the first direction and engaged with the second edge, the first groove and the second groove being provided at a same level as the center of the component body in a thickness direction of the board.

2. The semiconductor storage device according to claim 1, wherein
a length of the holder in the first direction is shorter than a length of the component body in the first direction.

3. The semiconductor storage device according to claim 1, wherein
the holder body has a ring shape and surrounds an outer peripheral surface of the component body.

4. The semiconductor storage device according to claim 1, wherein the first groove and the second groove are provided at the same level as the center of the holder in the thickness direction of the board.

5. The semiconductor storage device according to claim 1, wherein
the first groove and the second groove are provided at levels different from the center of the holder in the thickness direction of the board.

6. The semiconductor storage device according to claim 5, wherein
the board includes an upper surface including a pad and a lower surface positioned on a side of the board opposite to the upper surface,
the first groove and the second groove are provided below the board when viewed from the center of the holder along the first direction, and
the lead extends linearly from the component body in the first direction and is bonded to the pad.

7. The semiconductor storage device according to claim 1, wherein
each of the first groove and the second groove includes, in a cross section along the second direction and a third direction corresponding to the thickness direction of the board, a first portion whose width in the third direction is larger than a thickness of the board, a second portion whose width in the third direction is smaller than the thickness of the board, and a third portion whose width in the third direction gradually decreases from the first portion toward the second portion.

8. The semiconductor storage device according to claim 1, wherein the opening is a notch that is bounded by the first and second edges, and a third edge.

9. The semiconductor storage device according to claim 1, wherein the opening is bounded by the first and second edges in the second direction, and third and fourth edges in the first direction.

10. A semiconductor storage device comprising:
a board including a notch of which one end is open;
an electronic component including a component body disposed in the notch and a lead protruding from the component body and connected to the board; and
a holder disposed in the notch and supporting the component body, wherein
the notch includes a first edge that extends along a first direction and a second edge that is separated from the first edge in a second direction crossing the first direction and extends along the first direction,
the holder includes a first groove extending along the first direction and engaged with the first edge, and a second groove extending along the first direction and engaged with the second edge,
each of the first groove and the second groove includes, in a cross section along the second direction and a third direction corresponding to a thickness direction of the board, a first portion whose width in the third direction is larger than a thickness of the board, a second portion whose width in the third direction is smaller than the thickness of the board, and a third portion disposed between the first portion and the second portion, the third portion having a width in the third direction that gradually decreases from the first portion toward the second portion, and
the first groove and the second groove are each provided at the same level as the center of the electronic component in the thickness direction of the board.

11. The semiconductor storage device according to claim 10, wherein the holder further includes a cover including a portion that overlaps with the component body when viewed from the first direction, and a holding part extending from the cover along a portion of an outer shape of the component body and supporting the component body in the second direction.

12. The semiconductor storage device according to claim 11, wherein
a width of the holder in the third direction is smaller than a width of the component body in the third direction.

13. The semiconductor storage device according to claim 12, wherein
the board includes a first surface including a first pad and a second surface positioned on a side of the board opposite to the first surface and including a second pad,
the electronic component includes a plurality of leads including the lead, and
the plurality of leads include a first lead bonded to the first pad and a second lead bonded to the second pad.

14. The semiconductor storage device according to claim 13, wherein
the cover includes a plurality of through-holes through which the plurality of leads are passed, and
a direction in which the first groove and the second groove are arranged is different from a direction in which the plurality of through-holes are arranged.

15. A semiconductor storage device comprising:
a board having a region with an opening;
an electronic component including a component body disposed in the opening and a lead protruding from the component body and connected to the board; and
a holder disposed in the opening and supporting the component body, wherein the region includes first and second edges on either side of the opening, the first and second edges extending along a first direction and separated from each other in a second direction crossing the first direction,
the holder includes a holder body at least partially formed in an annular shape and into which the component body is inserted, a first engagement part extending along the first direction and engaged with the first edge, and a second engagement part extending along the first direction and engaged with the second edge, and
the first engagement part and the second engagement part are each provided at the same level as the center of the electronic component in a thickness direction of the board.

16. The semiconductor storage device according to claim 15, wherein the first and second engagement parts are each a groove that is engaged with a corresponding one of the first and second edges.

17. The semiconductor storage device according to claim 16, wherein the groove has one of an arc-shape, V-shape, and a trapezoidal shape.

18. The semiconductor storage device according to claim 15, wherein the first engagement part is a groove that is engaged with the first edge and the second engagement part is a protrusion that is supported by the second edge.

19. The semiconductor storage device according to claim 15, wherein the opening is a notch that is bounded by the first and second edges, and a third edge.

20. The semiconductor storage device according to claim 15, wherein the opening is bounded by the first and second edges in the second direction, and third and fourth edges in the first direction.

* * * * *